United States Patent
Hao et al.

(10) Patent No.: US 11,349,483 B1
(45) Date of Patent: May 31, 2022

(54) PRESCALER FOR A FREQUENCY DIVIDER

(71) Applicant: QUALCOMM INCORPORATED, San Diego, CA (US)

(72) Inventors: Shilei Hao, San Diego, CA (US); Yunliang Zhu, San Diego, CA (US); Yiwu Tang, San Diego, CA (US); Dongmin Park, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/391,406

(22) Filed: Aug. 2, 2021

(51) Int. Cl.
*H03K 23/00* (2006.01)
*H03K 23/44* (2006.01)
*H03K 3/356* (2006.01)
*H03K 21/10* (2006.01)
*H03K 23/40* (2006.01)

(52) U.S. Cl.
CPC ....... *H03K 23/44* (2013.01); *H03K 3/356121* (2013.01); *H03K 21/10* (2013.01); *H03K 23/40* (2013.01)

(58) Field of Classification Search
None
See application file for complete search history.

(56) References Cited

U.S. PATENT DOCUMENTS

| | | | | |
|---|---|---|---|---|
| 6,100,730 A * | 8/2000 | Davis | ............... | H03K 3/356121 327/117 |
| 6,130,564 A * | 10/2000 | Wang | ..................... | H03K 23/44 327/114 |
| 6,448,831 B1 | 9/2002 | Hunt, Jr. et al. | | |
| 9,124,278 B1 * | 9/2015 | Das | ......................... | G11C 27/02 |
| 9,924,466 B1 * | 3/2018 | Leuciuc | ............... | H04W 52/029 |
| 11,095,275 B1 * | 8/2021 | Elsayed | ................ | H03K 3/012 |
| 2005/0242861 A1 * | 11/2005 | Kanda | .............. | H03K 3/356113 327/218 |
| 2006/0082405 A1 * | 4/2006 | Chatterjee | ........ | H03K 3/356121 327/218 |
| 2010/0219873 A1 * | 9/2010 | Chang | ............ | H03K 19/018528 327/333 |
| 2014/0376683 A1 * | 12/2014 | Goldblatt | ............... | H03K 21/17 377/121 |
| 2021/0184662 A1 * | 6/2021 | Furuya | ............. | H03K 3/356104 |

FOREIGN PATENT DOCUMENTS

| CN | 102739239 A | 10/2012 |
|---|---|---|
| CN | 105162438 A | 12/2015 |
| CN | 108322212 A | 7/2018 |

* cited by examiner

*Primary Examiner* — Tuan T Lam
(74) *Attorney, Agent, or Firm* — Smith Tempel Blaha LLC/Qualcomm

(57) ABSTRACT

A hybrid true single-phase clock (H-TSPC) circuit includes a first logic circuit comprising non-ratio (NR) logic, a first mode switching device coupled to an output of the first logic circuit, a second logic circuit comprising ratio (R) logic, the second logic circuit configured to receive an output of the first logic circuit, a second mode switching device coupled to an output of the second logic circuit, a third logic circuit comprising non-ratio (NR) logic, the third logic circuit configured to receive an output of the second logic circuit, and a third mode switching device coupled to an output of the third logic circuit, wherein the first logic circuit, second logic circuit, and third logic circuit are configured in a ring.

23 Claims, 15 Drawing Sheets

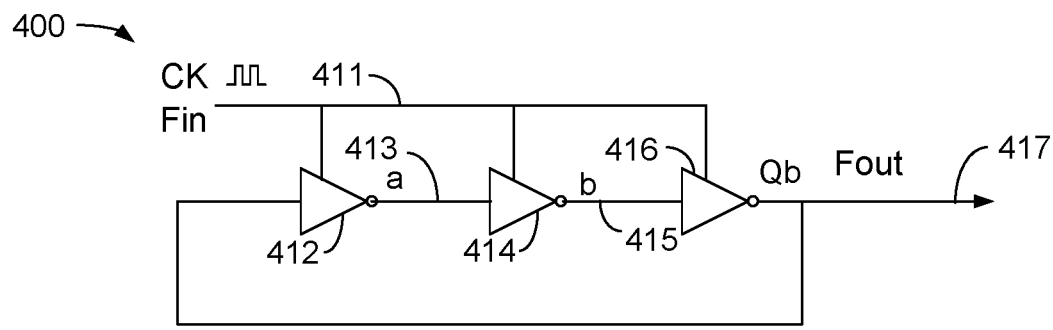
FIG. 4
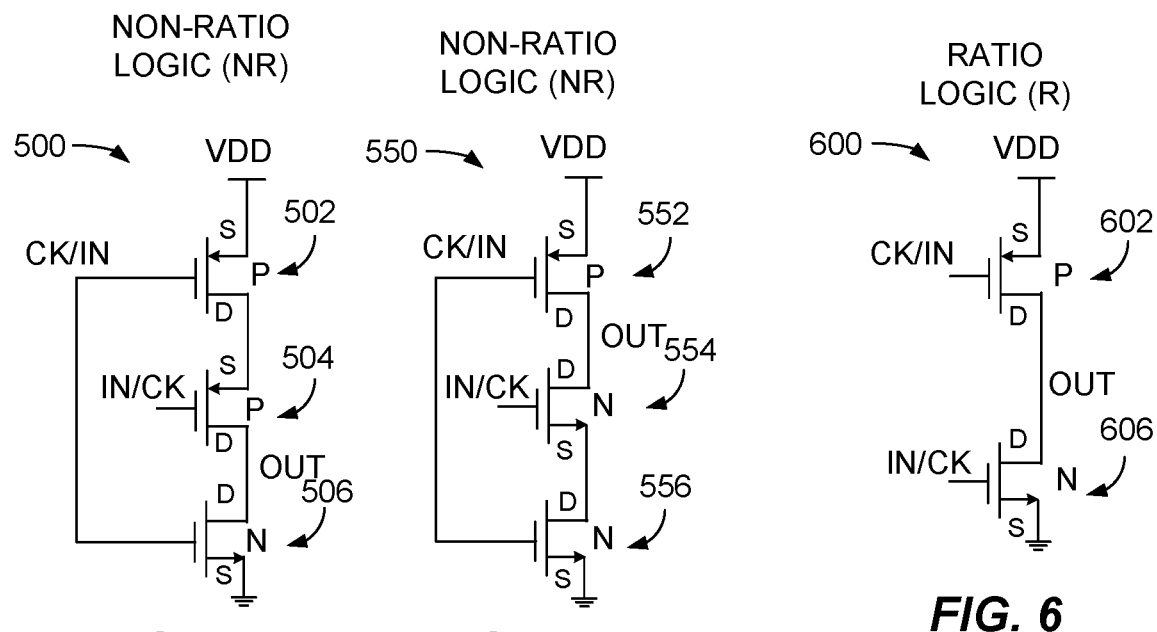
FIG. 5A   FIG. 5B   FIG. 6

PRESCALER FOR A FREQUENCY DIVIDER

FIELD

The present disclosure relates generally to electronics, and more specifically to radio frequency (RF) transmitters and receivers.

BACKGROUND

Wireless communication devices and technologies are becoming ever more prevalent. Wireless communication devices generally transmit and/or receive communication signals. A communication signal is typically processed by a variety of different components and circuits. One of the circuits which may be involved in the processing of a communication signal is a frequency synthesizer. A frequency synthesizer typically includes a phase locked loop (PLL). A PLL is a device that compares the phase and/or frequency of two different signals and generates an error signal that represents the phase and/or frequency difference between the two compared signals. When the two signals have different phase and/or frequencies, the phase and/or frequency difference between the two signals is constantly varying. The error signal is then used to control the phase and/or frequency of the loop, such that when the phase and/or frequency difference between the two signals is fixed, the two signals are at the same phase and/or frequency. A PLL typically includes a phase and/or frequency comparator or detector, a voltage controlled oscillator (VCO) that can adjust the frequency of the PLL based on a control voltage signal, a filter circuit, a feedback circuit that includes a frequency divider, and may include other circuits, such as a buffer circuit, etc.

A frequency divider in a feedback circuit divides the VCO output frequency down to compare with the input reference in the synthesizer. An output of the VCO (Fvco) may be provided as an input to the frequency divider. The frequency divider divides the Fvco signal according to a divide ratio, where the divide ratio may be "N." The value of "N" may be an integer or a fraction. In a millimeter wave communication system, the VCO output frequency may be on the order of tens of gigahertz (GHz), and in an exemplary embodiment, may be 21.5 GHz. The ability to continuously change the divide ratio, N, at millimeter wave frequencies is challenging, particularly when it is also desirable to have the ability to adjust the divide ratio using a ratio step size of one (1).

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a hybrid true single-phase clock (H-TSPC) circuit including a first logic circuit comprising non-ratio (NR) logic, a first mode switching device coupled to an output of the first logic circuit, a second logic circuit comprising ratio (R) logic, the second logic circuit configured to receive an output of the first logic circuit, a second mode switching device coupled to an output of the second logic circuit, a third logic circuit comprising non-ratio (NR) logic, the third logic circuit configured to receive an output of the second logic circuit, and a third mode switching device coupled to an output of the third logic circuit, wherein the first logic circuit, second logic circuit, and third logic circuit are configured in a ring.

Another aspect of the disclosure provides a method for frequency division, including propagating a signal through a divider having a ratio logic (R) circuit and a non-ratio (NR) circuit, setting at least one mode switching device that is coupled to an output of the R circuit or the NR circuit to a first mode, outputting a first signal having a first divide ratio, setting the at least one mode switching device that is coupled to an output of the R circuit or the NR circuit to a second mode, and outputting a second signal having a second divide ratio different from the first divide ratio.

Another aspect of the disclosure provides a method for frequency division including selectively dividing an input signal by one (1) or by two (2) to develop an intermediate signal, selectively dividing the intermediate signal by two (2) or by three (3) to develop a second intermediate signal, and dividing the second intermediate signal by two (2) to develop a third intermediate signal, wherein the selectively dividing the input signal comprises dividing the input signal with a hybrid true single phase clock (H-TSPC) circuit or wherein the selectively dividing the intermediate signal comprises dividing the intermediate signal with an H-TSPC circuit.

Another aspect of the disclosure provides a frequency divider circuit including a prescaler having a DIV 1/2 frequency divider, and a DIV 4/5 frequency divider, the DIV 4/5 frequency divider comprising a DIV 2/3 frequency divider and a DIV 2 frequency divider, wherein at least one of the DIV 1/2 frequency divider and the DIV 2/3 frequency divider comprises a hybrid true single phase clock (H-TSPC) architecture, and wherein the H-TSPC architecture includes a first logic circuit comprising non-ratio (NR) logic, a second logic circuit comprising ratio (R) logic, the second logic circuit configured to receive an output of the first logic circuit, and a third logic circuit comprising non-ratio (NR) logic, the third logic circuit configured to receive an output of the second logic circuit, wherein the first logic circuit, second logic circuit, and third logic circuit are configured in a ring.

BRIEF DESCRIPTION OF THE DRAWINGS

In the figures, like reference numerals refer to like parts throughout the various views unless otherwise indicated. For reference numerals with letter character designations such as "102*a*" or "102*b*", the letter character designations may differentiate two like parts or elements present in the same figure. Letter character designations for reference numerals may be omitted when it is intended that a reference numeral encompass all parts having the same reference numeral in all figures.

FIG. 4 shows an exemplary embodiment of a divider circuit, which may be implemented in a programmable divider, such as the programmable divider of FIG. 3.

FIG. 5A is a schematic diagram illustrating an example of an embodiment of a non-ratio (NR) logic inverter circuit that may be implemented in a hybrid true single phase clock (H-TSPC) circuit architecture.

FIG. 5B is a schematic diagram illustrating an example of an alternative embodiment of a non-ratio (NR) logic inverter circuit that may be implemented in an H-TSPC circuit architecture.

FIG. 6 is a schematic diagram illustrating an example of an embodiment of a ratio (R) logic inverter circuit that may be implemented in an H-TSPC circuit architecture.

DETAILED DESCRIPTION

The word "exemplary" is used herein to mean "serving as an example, instance, or illustration." Any aspect described herein as "exemplary" is not necessarily to be construed as preferred or advantageous over other aspects.

In a modern wireless communication device, there are a number of uses for a frequency divider. A prescaler is one part of a frequency divider and may be used to precondition an input signal. A prescaler is an electronic counting circuit used to reduce a high frequency electrical signal to a lower frequency by integer division. For example, a programmable divider (for example, a divide-by-N divider) divides a VCO output frequency down to compare with the input reference in a synthesizer. The ability to continuously vary the divide ratio (N) of such a divider is desirable, but is challenging at millimeter wave (mmW) frequencies due to the high input frequency.

A divide ratio step size of one (1) is preferred for improved VCO frequency resolution in integer-N divide mode and to minimize delta-sigma modulation (DSM) quantization noise in fractional-N divide mode.

One prior solution is to add a divide-by-2 divider ahead of a dual modulus prescaler. Adding a divide-by-2 (DIV 2) divider ahead of a dual modulus prescaler increases maximum operation frequency, but may lead to even number divide ratio of 2×Fref channel frequency resolution, where a 1×Fref channel frequency resolution is sometimes preferred. Further, this solution uses a multiplexer (MUX) to select whether the additional divide-by-2 (DIV 2) divider ahead of a dual modulus prescaler is selected or bypassed. This MUX introduces additional loading to the input signal and also consumes additional power because it is always in the circuit. As used herein, the term "dual modulus" refers to a frequency divider that may have two selectable values for its frequency divisor, such as, for example, M and M+1. Exemplary embodiments of the disclosure are directed to a prescaler for a frequency divider that uses a hybrid true single phase clock (H-TSPC) architecture to achieve a continuous divide ratio of a step size of one (1), while maintaining the ability to operate reliably at millimeter wave (mmW) frequencies. In this manner, the tradeoff between operating frequency and divider ratio resolution may be optimized.

One manner of implementing a prescaler for a frequency divider is referred to as a true single-phase clock (TSPC) circuit, which may use three (or more) clock-controlled inverter stages. A TSPC circuit may be a digital circuit having transistor devices arranged in what is referred to as non-ratio logic (NR) or ratio logic (R). Each of NR logic and R logic has benefits and drawbacks when used as elements in a divider circuit at millimeter wave frequencies.

Figure 1:
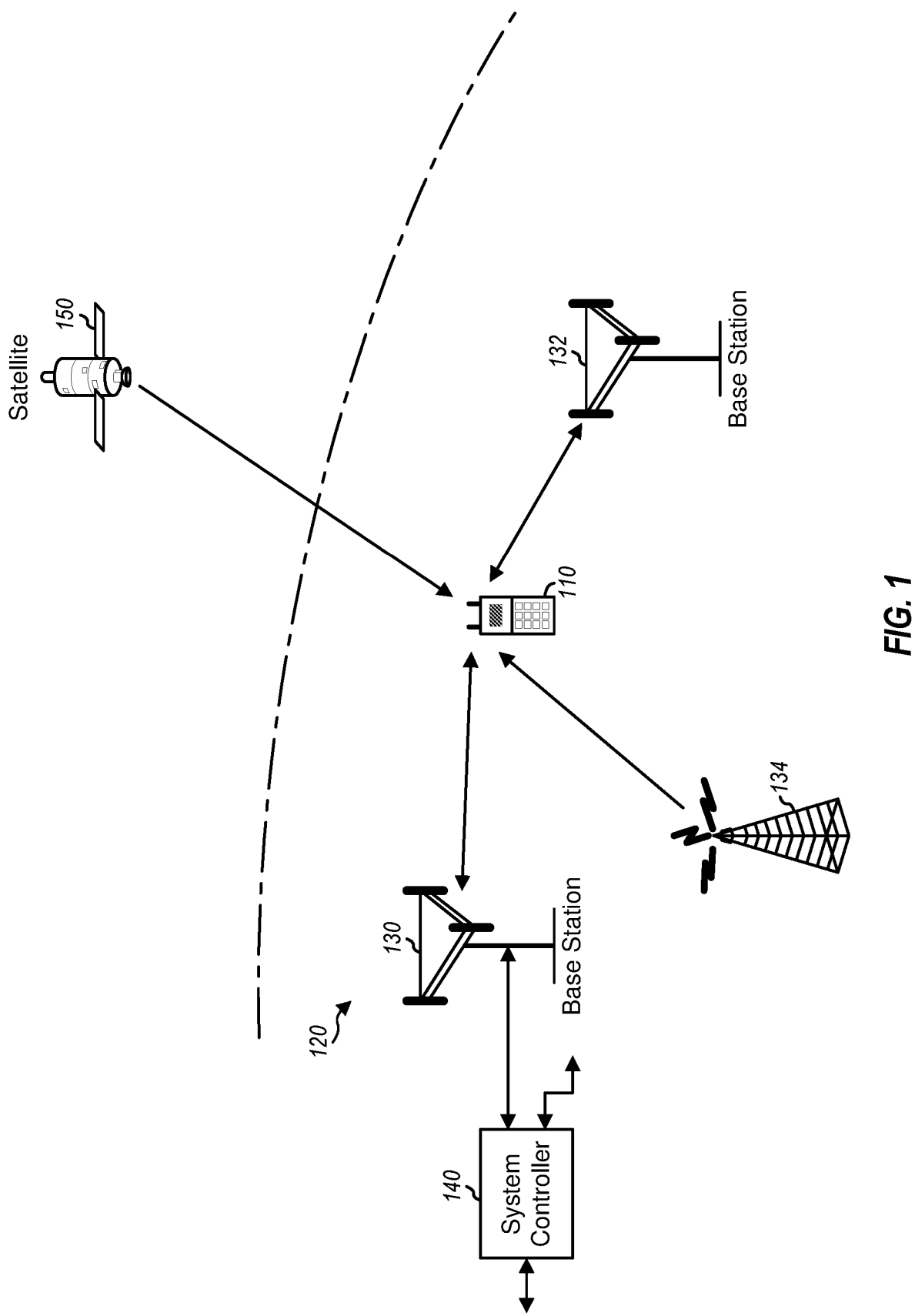
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, an automobile, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150 in one or more global navigation satellite systems (GNSS)), etc. Wireless device 110 may support one or more radio technologies for wireless communication such as LTE, WCDMA, CDMA 1x, EVDO, TD-SCDMA, GSM, 802.11, 5G, Bluetooth, etc.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams. Wireless device 110 may be able to operate in a variety of communication bands including, for example, those communication bands used by LTE, WiFi, 5G, Bluetooth, or other communication bands, over a wide range of frequencies. Wireless device 110 may additionally or alternatively be capable of communicating directly with other wireless devices without communicating through a network.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
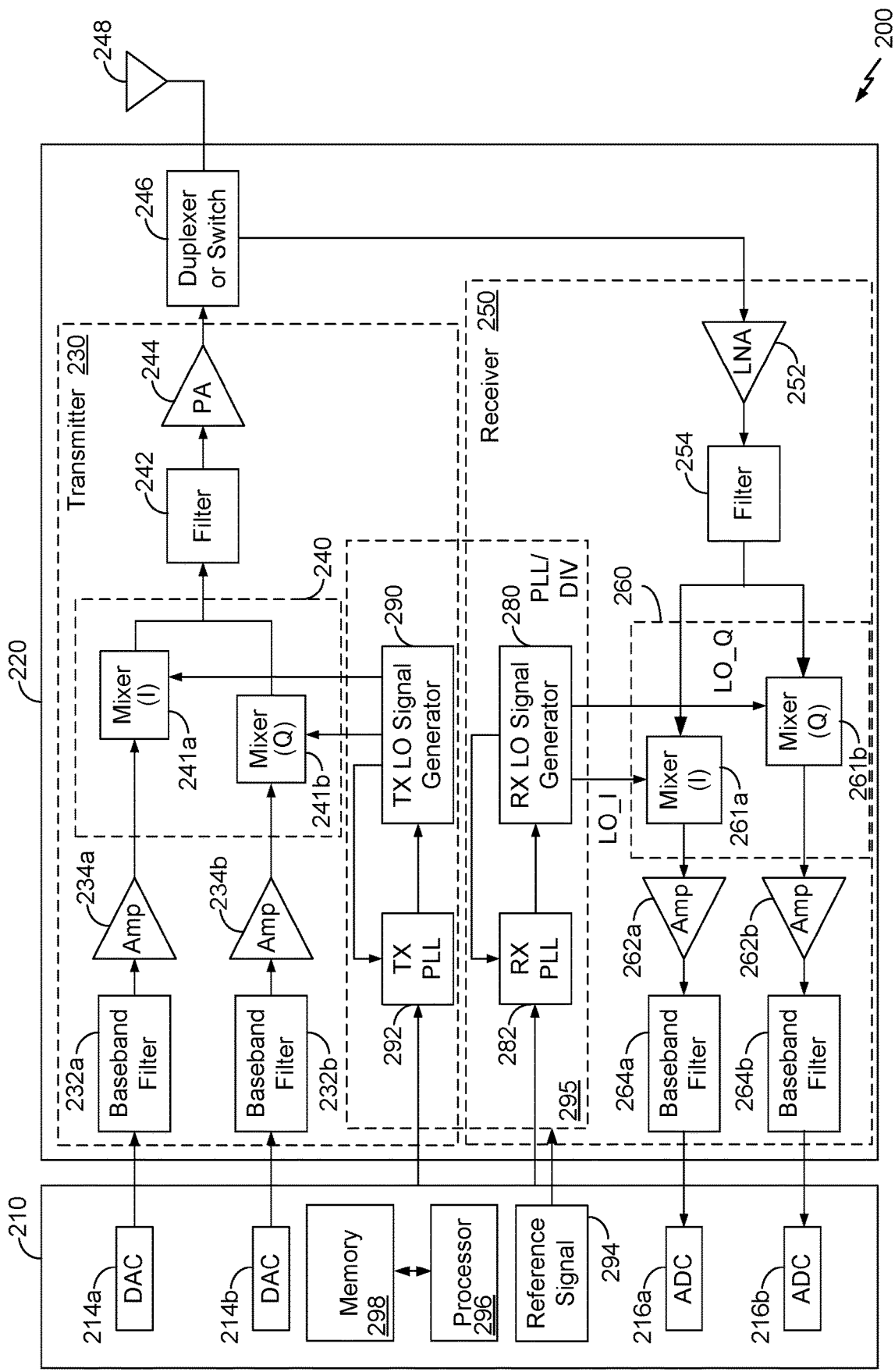
FIG. 2 is a block diagram showing a wireless device in which the exemplary techniques of the present disclosure may be implemented.

FIG. 2 is a block diagram showing a wireless device 200 in which exemplary techniques of the present disclosure may be implemented. The wireless device 200 may, for example, be an embodiment of the wireless device 110 illustrated in FIG. 1.

FIG. 2 shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other figure in the drawings, may be either single-ended or differential. Some circuit blocks in FIG. 2 may also be omitted.

In the example shown in FIG. 2, wireless device 200 generally comprises the transceiver 220 and a data processor 210. The data processor 210 may include a processor 296 operatively coupled to a memory 298. The memory 298 may be configured to store data and program codes, and may generally comprise analog and/or digital processing elements. The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214a and 214b for converting digital signals generated by the data processor 210 into the I and Q analog output signals, e.g., I and Q output currents, for further processing. In other embodiments, the DACs 214a and 214b are included in the transceiver 220 and the data processor 210 provides data (e.g., for I and Q) to the transceiver 220 digitally.

Within the transmitter 230, lowpass filters 232a and 232b filter the I and Q analog transmit signals, respectively, to remove undesired images caused by the prior digital-to-analog conversion Amplifiers (Amp) 234a and 234b amplify the signals from lowpass filters 232a and 232b, respectively, and provide I and Q baseband signals. An upconverter 240 upconverts the I and Q baseband signals (for example using mixers 241a, 241b) with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal may be routed through a duplexer or switch 246 and transmitted via an antenna 248. While examples discussed herein utilize I and Q signals, those of skill in the art will understand that elements of the transceiver may be configured to utilize polar modulation.

In the receive path, antenna 248 receives communication signals and provides a received RF signal, which may be routed through duplexer or switch 246 and provided to a low noise amplifier (LNA) 252. The duplexer 246 is designed to operate with a specific RX-to-TX duplexer frequency separation, such that RX signals are isolated from TX signals. The received RF signal is amplified by LNA 252 and filtered by a filter 254 to obtain a desired RF input signal. Downconversion mixers 261a and 261b in a downconverter 260 mix the output of filter 254 with I and Q receive (RX) LO signals (i.e., LO_I and LO_Q) from an RX LO signal generator 280 to generate I and Q baseband signals. The I and Q baseband signals are amplified by amplifiers 262a and 262b and further filtered by lowpass filters 264a and 264b to obtain I and Q analog input signals, which are provided to data processor 210. In the exemplary embodiment shown, the data processor 210 includes analog-to-digital-converters (ADC's) 216a and 216b for converting the analog input signals into digital signals to be further processed by the data processor 210. In some embodiments, the ADCs 216a and 216b are included in the transceiver 220 and provide data to the data processor 210 digitally.

In FIG. 2, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

In an exemplary embodiment, the RX PLL 282, the TX PLL 292, the RX LO signal generator 280, and the TX LO signal generator 290 may alternatively be combined into a single LO generator circuit 295, which may include common or shared LO signal generator circuitry to provide the TX LO signals and the RX LO signals. Alternatively, separate LO generator circuits may be used to generate the TX LO signals and the RX LO signals. In an exemplary embodiment, a reference signal element 294 may be located in the data processor 210 or elsewhere in the wireless communication device 200 and be configured to provide a reference signal to the RX PLL 282 and the TX PLL 292. In some embodiments, a reference signal element 294 is implemented separate from the data processor 210 and/or is configured to generate a reference signal based on a signal from an oscillator, for example a crystal oscillator.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain elements of the transceiver 220 are functionally illustrated in FIG. 2, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules. For example, the power amplifier 244, the filter 242, and the duplexer 246 may be implemented in separate modules or as discrete components, while the remaining elements illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide linearity, efficiency, or a combination of linearity and efficiency.

Figure 3:
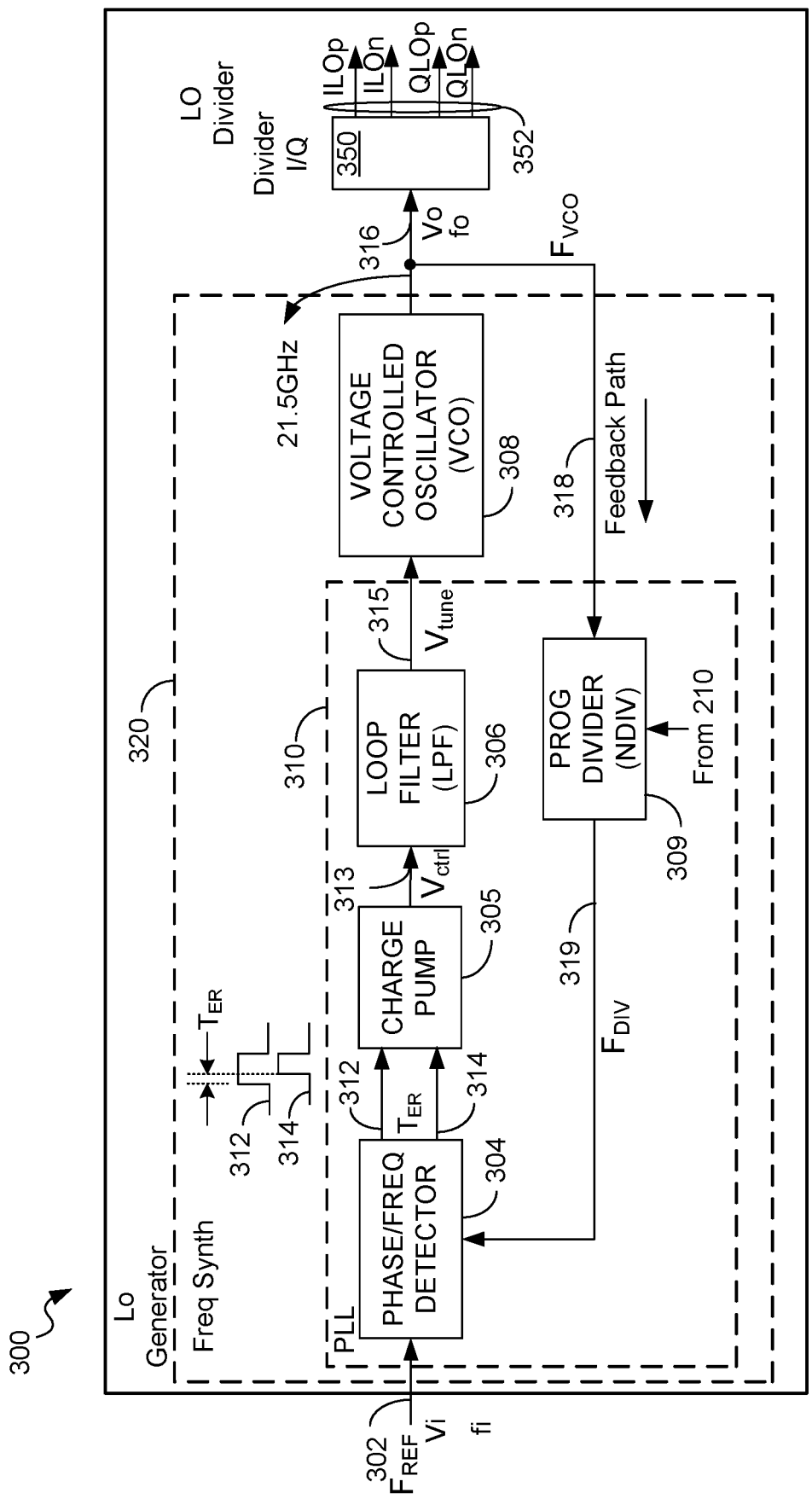
FIG. 3 is a block diagram of a local oscillator (LO) generator circuit of FIG. 2.

FIG. 3 is a block diagram of an LO generator circuit 300. In an exemplary embodiment, the LO generator circuit may be similar to an LO generator circuit 295 of FIG. 2 or to either of the LO signal generators 280, 290. In an exemplary embodiment, the LO generator circuit 300 may generate both TX LO signals and RX LO signals, or may generate only TX LO signals or only RX LO signals. In an exemplary embodiment, the LO generator circuit 300 may comprise a frequency synthesizer 320 having a PLL circuit 310 and a voltage-controlled oscillator (VCO). The LO generator circuit 300 may also comprise an LO divider 350. In an exemplary embodiment, the LO divider 350 may be a "divide-by-two" (DIV/2 or DIV 2) divider that may be configured to generate in-phase and quadrature LO signals.

In an exemplary embodiment, the PLL circuit 310 includes a phase/frequency detector (PFD) 304, a charge pump 305, a loop filter 306, and a feedback circuit, which may comprise a programmable divider (NDIV) 309. In an exemplary embodiment, the loop filter 306 may be a low pass filter (LPF). The programmable divider (NDIV) 309 may be an integer-N divider or a fractional-N divider, and may also be referred to as a PLL divider. The programmable divider (NDIV) 309 may be implemented using exemplary embodiments described herein.

An input signal Vi with an input phase and frequency fi is provided over connection 302 to the phase/frequency detector 304. In some embodiments, the input signal on connection 302 may be referred to as a reference clock signal, or a reference frequency signal, $F_{REF}$, for example provided by the reference signal element 294 (FIG. 2). In an exemplary embodiment, the phase/frequency detector 304 may comprise a comparator, or other circuitry, which compares the input phase and frequency on connection 302 with a feedback signal based on an output voltage signal, Vo, after processing by the programmable divider 309 on connection 319. The phase/frequency detector 304 provides two signals on connections 312 and 314 where the difference in time between the rising edges of the signals on connections 312 and 314 represents the timing error, $T_{ER}$, representing the phase and frequency difference between the input signals on connections 302 and 319. In an exemplary embodiment, the phase/frequency detector 304 compares the input phase on connections 302 and 319 and converts the phase difference into a timing error, $T_{ER}$, which can be represented by the amount of time occurring between two rising edges of two signals on connections 312 and 314. The timing error, $T_{ER}$, is then provided over connections 312 and 314 to the charge pump 305. The charge pump 305 then converts the timing error, $T_{ER}$, into a control voltage, $V_{ctrl}$. In response to the timing error signal, the charge pump 305, which may operate as a time-to-voltage converter, raises or lowers the DC voltage on connection 313 based on whether the timing error, $T_{ER}$, is increasing or decreasing, and generates the control voltage, $V_{ctrl}$, on connection 313. If the timing error, $T_{ER}$, is zero (0), then the output of the charge pump 305 is constant. The output of the charge pump 305 is provided over connection 313 to the loop filter 306. In an exemplary embodiment, the phase/frequency detector 304 and the charge pump 305 may be combined in a single functional block. In an exemplary embodiment where the loop filter 306 is a low pass filter, the loop filter 306 removes high frequency noise from the output signal of the charge pump 305 on connection 313 and provides a steady DC level VCO tuning voltage $V_{tune}$, on connection 315.

The DC voltage $V_{tune}$ is then provided to the VCO/buffer 308. The frequency (fo) of the output of VCO/buffer 308 is directly proportional to the input signal, Vi. Both the input phase and frequency, fi, and output phase and frequency, fo, are compared and adjusted through the feedback path 318 until the output frequency, fo, equals the input frequency, fi, multiplied by the divide ratio. The programmable divider 309 may be programmable by, for example, the data processor 210 of FIG. 2, to provide a divide-by-N function (NDIV).

The output of the frequency synthesizer 320 on connection 316 is provided to the LO divider 350. In an exemplary embodiment, the LO divider 350 may be a divide-by-two (DIV/2) circuit configured to reduce the frequency of the signal in connection 316 by a factor of two (2). Further, the LO divider may be configured to generate in-phase and quadrature signals separated by 90 degrees. Other divide ratios are possible.

In an exemplary embodiment, the LO divider 350 divides the VCO signal on connection 316 in frequency and provides four divided signals comprising ILOp, ILOn, QLOp and QLOn signals on connection 352, which are 90 degrees out of phase with respect to each other. In general, a differential signal comprises a non-inverting signal denoted by a suffix "p" and a complementary inverting signal denoted by a suffix "n". The ILOp and ILOn signals may be provided to a mixer 261a and/or 241a (FIG. 2) and the QLOp and QLOn signals may be provided to a mixer 261b and/or 241b (FIG. 2). Other divider ratios are possible, with a quadrature divider described for illustrative purposes only.

In an exemplary embodiment, the wireless device 110 may support communication with wireless systems utilizing TDD and/or FDD. For TDD, the downlink and uplink share the same frequency, and downlink transmissions and uplink transmissions may be sent on the same frequency in different time periods. For FDD, the downlink and uplink are allocated separate frequencies. Downlink transmissions may be sent on one frequency, and uplink transmissions may be sent on another frequency. Some exemplary radio technologies supporting TDD include LTE TDD, TD-SCDMA, and GSM. Some exemplary radio technologies supporting FDD include LTE FDD, WCDMA, and CDMA 1×.

Exemplary embodiments of a prescaler for a frequency divider may be used to optimize the performance and power consumption of the programmable divider 309. The techniques described herein may be used for a prescaler for a frequency divider that uses a hybrid true single phase clock (H-TSPC) architecture to achieve a continuous divide ratio having a step size of one (1), while maintaining the ability to operate reliably at millimeter wave (mmW) frequencies.

FIG. 4 shows an exemplary embodiment of a divider circuit 400, which may be implemented in a programmable divider, such as the programmable divider 309 of FIG. 3. In an exemplary embodiment, the divider circuit 400 may be implemented using a hybrid true single phase clock (H-TSPC) architecture. In an exemplary embodiment, the divider circuit 400 comprises three clock-controlled inverters configured in a ring, the output frequency of which is one half of the input frequency. In other embodiments, the divider circuit 400 may include more than three (clock-controlled) inverters in the ring. The inverters are configured in a chain and the output of the last inverter is fed back into the first inverter. In an exemplary embodiment, the divider circuit 400 comprises inverters 412, 414, and 416. An input signal may be a clock signal (CK) at a frequency, Fin, presented over connection 411, and an output signal having an output frequency, Fout, may be taken from the inverter 416 over connection 417. An output of the inverter 412 on connection 413 may be referred to as "a", an output of the inverter 414 on connection 415 may be referred to as "b" and an output of the inverter 416 on connection 417 may be referred to as "Qb."

Each inverter 412, 414 and 416 may be implemented using what is referred to as non-ratio logic (NR) logic or ratio logic (R). In an exemplary embodiment, different ones of the inverters 412, 414 and 416 in the divider circuit 400, may be implemented using either non-ratio (NR) logic or ratio (R) logic, which may result in the divider circuit 400 having an H-TSPC architecture.

FIG. 5A is a schematic diagram illustrating an example of an embodiment of a non-ratio (NR) logic inverter circuit 500 that may be implemented in a hybrid true single phase clock (H-TSPC) circuit architecture. In an exemplary embodiment, the NR logic circuit 500 comprises a combination of P-type metal oxide semiconductor (PMOS) transistors and N-type metal oxide semiconductor (NMOS) transistors. For example, in the embodiment shown in FIG. 5A, the NR logic circuit 500 comprises PMOS transistor devices 502 and 504, and NMOS transistor device 506. There are two exemplary connection options. One connection option is that the signal IN connects to the gates of the transistors 502 and 506 and the signal CK connects to the gate of the transistor 504. Another connection option is that the signal IN connects to the gate of the transistor 504 and the signal CK connects to the gates of the transistors 502 and 506.

FIG. 5B is a schematic diagram illustrating an example of an alternative embodiment of a non-ratio (NR) logic inverter circuit 550 that may be implemented in an H-TSPC circuit architecture. In an exemplary embodiment, the NR logic circuit 550 comprises a combination of P-type metal oxide semiconductor (PMOS) transistors and N-type metal oxide semiconductor (NMOS) transistors. For example, in the embodiment shown in FIG. 5B, the NR logic circuit 550 comprises PMOS transistor device 552, and NMOS transistor devices 554 and 556. There are two connection options. One connection option is that the signal IN connects to the gates of the transistors 552 and 556 and the signal CK connects to the gate of the transistor 554. Another connection option is that the signal IN connects to the gate of the transistor 554 and the signal CK connects to the gates of the transistors 552 and 556.

FIG. 6 is a schematic diagram illustrating an example of an embodiment of a ratio (R) logic inverter circuit 600 that may be implemented in an H-TSPC circuit architecture. In an exemplary embodiment, the R logic circuit 600 comprises a combination of P-type metal oxide semiconductor (PMOS) transistors and N-type metal oxide semiconductor (NMOS) transistors. For example, in the embodiment shown in FIG. 6, the R logic circuit 600 comprises PMOS transistor device 602, and NMOS transistor device 606. There are two connection options. One connection option is that the signal IN connects to the gate of the transistor 602 and the signal CK connects to the gate of the transistor 606. Another connection option is that the signal IN connects to the gate of the transistor 606 and the signal CK connects to the gate of the transistor 602. The embodiments described herein can be implemented using either PMOS or NMOS devices. In an exemplary embodiment, implementing the ratio (R) logic inverter circuit 600 as the middle stage (inverter 414) of the divider circuit 400 (FIG. 4), improves the speed of the critical timing path through the divider circuit 400 because the ratio (R) logic inverter circuit 600 has only two transistors and therefore there is a smaller delay through the ratio (R) logic inverter circuit 600 than through either NR logic inverter circuits 500 or 550.

Figure 7:
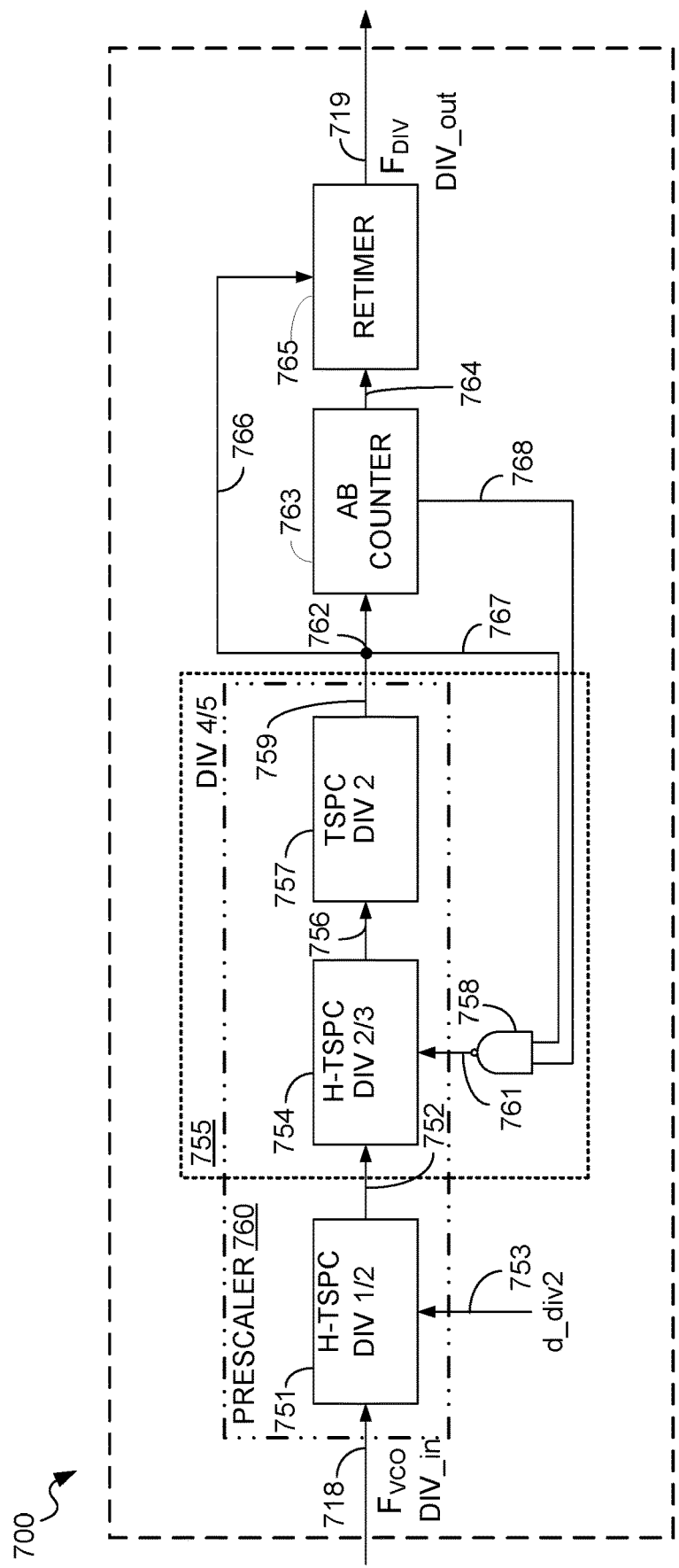
FIG. 7 is a block diagram of a frequency divider in accordance with an exemplary embodiment of the disclosure.

FIG. 7 is a block diagram of a frequency divider 700 in accordance with an exemplary embodiment of the disclosure. In an exemplary embodiment, the frequency divider 700 may be an example of the programmable divider 309 shown in FIG. 3. In an exemplary embodiment, the frequency divider 700 may comprise a DIV 1/2 divider 751, a DIV 4/5 divider 755, an AB counter 763, a retimer 765 and a logic gate 758. As used herein, the terminology "DIV 1/2" refers to a divider that can selectively divide a signal by one (DIV 1) or by two (DIV 2), the terminology "DIV 2/3" refers to a divider that can selectively divide a signal by two (DIV 2) or by three (DIV 3), and the terminology "DIV 4/5" refers to a divider that can selectively divide a signal by four (DIV 4) or by five (DIV 5). In an exemplary embodiment, the DIV 4/5 divider 755 may comprise a DIV 2/3 divider 754 and a DIV 2 divider 757. In an exemplary embodiment, the DIV 1/2 divider 751 and the DIV 4/5 divider 755 may form what is referred to as a prescaler 760.

In an exemplary embodiment, the DIV 1/2 divider 751 and the DIV 2/3 divider 754 in the prescaler 760 may be implemented using H-TSPC architecture as described herein. The DIV 2 divider 757 may be implemented using TSPC architecture.

In an exemplary embodiment, a divider input (DIV_in) signal $F_{VCO}$ may be provided over connection 718 to the DIV 1/2 divider 751. A control signal, d_div2, may be provided to the DIV 1/2 divider 751 over connection 753. The control signal, d_div2, may be provided by the data processor 210 (FIG. 2) or by another controller. In an exemplary embodiment, the control signal, d_div2, on connection 753 determines whether the DIV 1/2 divider 751 operates in a divide-by-one (DIV 1) mode or in a divide-by-two (DIV 2) mode. While not illustrated in FIG. 7, another control signal (for example a second control signal or control signal which is opposite d_div2, such as d_div2b) may be provided to the DIV 1/2 divider 751 over connection 753 or another connection, and may be provided by the data processor 210 or another controller. The other control signal maybe used in combination with d_div2 to determine whether the DIV 1/2 divider 751 operates in a divide-by-one (DIV 1) mode or in a divide-by-two (DIV 2) mode.

An output of the DIV 1/2 divider 751 is provided over connection 752 to the DIV 2/3 divider 754. The output of the DIV 1/2 divider 751 may be referred to as an intermediate signal or an intermediate input signal. In an exemplary embodiment, if the DIV 1/2 divider 751 is operated in a divide by one (1) mode, then the signal on connection 752 will have the same frequency as the signal on connection 718. In an exemplary embodiment, if the DIV 1/2 divider 751 is operated in a divide by two (2) mode, then the signal on connection 752 will have a frequency that is one half the frequency of the signal on connection 718. An output of the DIV 2/3 divider 754 is provided over connection 756 to the DIV 2 divider 757. The output of the DIV 2/3 divider 754 may be referred to as a second intermediate signal or a second intermediate input signal. In an exemplary embodiment, if the DIV 2/3 divider 754 is operated in a divide by two (2) mode, then the signal on connection 756 will have a frequency that is one half the frequency of the signal on connection 752. In an exemplary embodiment, if the DIV 2/3 divider 754 is operated in a divide by three (3) mode, then the signal on connection 756 will have a frequency that is one third the frequency of the signal on connection 752. An output of the DIV 2 divider 757 is provided over connection 759 to the AB counter 763. The output of the DIV 2 divider 757 may be referred to as a third intermediate signal or a third intermediate input signal. In an exemplary embodiment, the signal on connection 759 will have a frequency that is one half the frequency of the signal on connection 756. An output of the AB counter 763 is provided over connection 764 to the retimer 765. An output of the retimer 765 is provided over connection 716 as the divider output (DIV_out) signal, $F_{DIV}$.

In an exemplary embodiment, the AB counter 763 may be configured to further divide the output of the DIV 4/5 divider 755 on connection 759 according to a desired divide ratio N, which may be determined by the data processor 210. In addition, the AB counter 763 may be configured to generate the initial mode control signal to control the DIV 4/5 divider 755 to operate in either DIV 4 mode or DIV 5 mode, which allows the prescaler 760 to realize a divide ratio step size resolution of one (1). The retimer 765 may be configured to resample the output of the AB counter 763 at the rising edge or the falling edge of the output of the DIV 4/5 divider 755 on connection 759, thus improving the phase noise of the divider output on connection 719.

An output of the DIV 2 divider 757 on connection 759 at the node 762 is provided over connection 767 to one input of the logic gate 758. The output of the DIV 2 divider 757 at node 762 is also provided over connection 766 to the retimer 765. An output of the AB counter 763 on connection 768 is provided to another input of the logic gate 758. The output of the logic gate 758 on connection 761 sets the divide ratio of the DIV 2/3 divider 754 to either divide-by-two (DIV 2), or divide-by-three (DIV 3). In an exemplary embodiment, the logic gate 758 comprises NAND logic. One input to the logic gate 758 on connection 768 comprises an initial mode control signal for the DIV 2/3 divider 754, and another input to the logic gate 758 on connection 767 comprises the output of the DIV 2 divider 757. The output of the DIV 2 divider 757 on connection 767 comprises a signal that is logic low for one half of a cycle and logic high for the other half of a cycle. The inputs to the logic gate 758 determine the state of the final mode control signal on connection 761. The output signal on connection 761 sets the DIV 2/3 divider 754 to a DIV 3 mode if both the signal on connection 768 is logic high, and the signal on connection 767 is logic high. During the time that the signal on connection 767 is logic low, the DIV 2/3 divider 754 is set to a DIV 2 mode. In this manner, a DIV 4 or DIV 5 mode may be realized by cascading the DIV 2/3 divider 754 and the DIV 2 divider 757.

In an exemplary embodiment, the hybrid true single phase clock (H-TSPC) architecture used in the DIV 1/2 divider 751 and the DIV 2/3 divider 754 allows the frequency divider 700 to achieve a continuous divide ratio of a step size of one (1) when the DIV 1/2 divider 751 operates in DIV 1 mode, while providing the ability to operate reliably at millimeter wave (mmW) frequencies. Operation at mmW frequencies is enhanced because of the timing advantage provided by the hybrid true single phase clock (H-TSPC) architecture used in the DIV 1/2 divider 751 and the DIV 2/3 divider 754, as described herein. Further, the use of the DIV 1/2 divider 751 may increase the maximum operating frequency of the frequency divider 700 without sacrificing minimum operating frequency when operating in DIV 2 mode. The primary advantage of the H-TSPC architecture is that it satisfies the critical timing limitation in the DIV 1/2 divider 751 and the DIV 2/3 divider 754 because the ratio logic (R) in the H-TSPC circuitry has fewer transistors than the non-ratio logic (NR), such that the maximum operating frequency may be increased without sacrificing the minimum operating frequency.

In an exemplary embodiment, the DIV 1/2 divider 751 allows the elimination of a MUX and reduces power consumption, circuit area, and input clock loading when operating in DIV 1 mode because in DIV 1 mode, the DIV 1/2 divider 751 is essentially, or effectively, bypassed, connecting the signal on connection 718 to connection 752 without a change in frequency.

Figure 8:
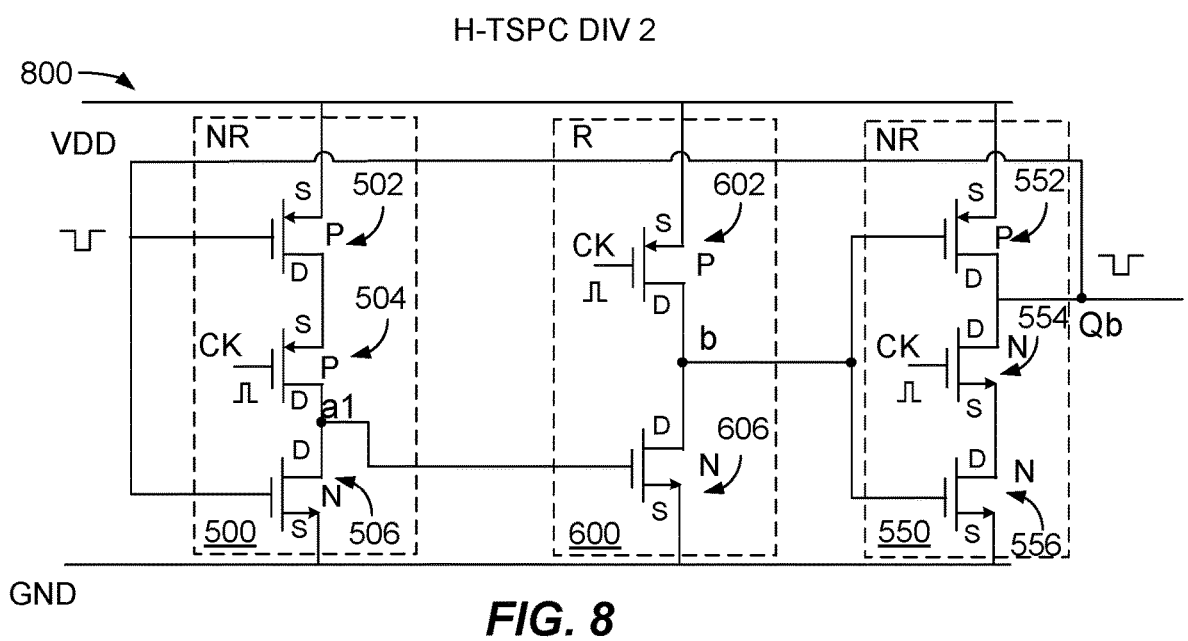
FIG. 8 is a schematic diagram illustrating an example of an embodiment of an H-TSPC circuit having a combination of NR logic circuits and an R logic circuit.

FIG. 8 is a schematic diagram illustrating an example of an embodiment of an H-TSPC circuit 800 having a combination of NR logic circuits and an R logic circuit configured in a ring. The embodiment of the H-TSPC circuit 800 comprises a DIV 2 circuit. In an exemplary embodiment, the H-TSPC circuit 800 comprises an embodiment of NR logic circuit 500, R logic circuit 600 and NR logic circuit 550. The NR logic circuit 500 may be an implementation of the inverter 412 (FIG. 4), the R logic circuit 600 may be an implementation of the inverter 414 (FIG. 4), and the NR logic circuit 550 may be an implementation of the inverter 416 (FIG. 4) in the divider circuit 400 of FIG. 4.

A signal (CK) at the gate of the transistors 504, 602 and 554 controls the three inverters 500, 600 and 550 in a feedback loop to generate the output Qb, the frequency of which in this embodiment may be one half of the CK frequency. The signal at the node Qb is also provided as input to the gate of the transistor 502 and the gate of the transistor 506, hence the feedback architecture.

Figure 9:
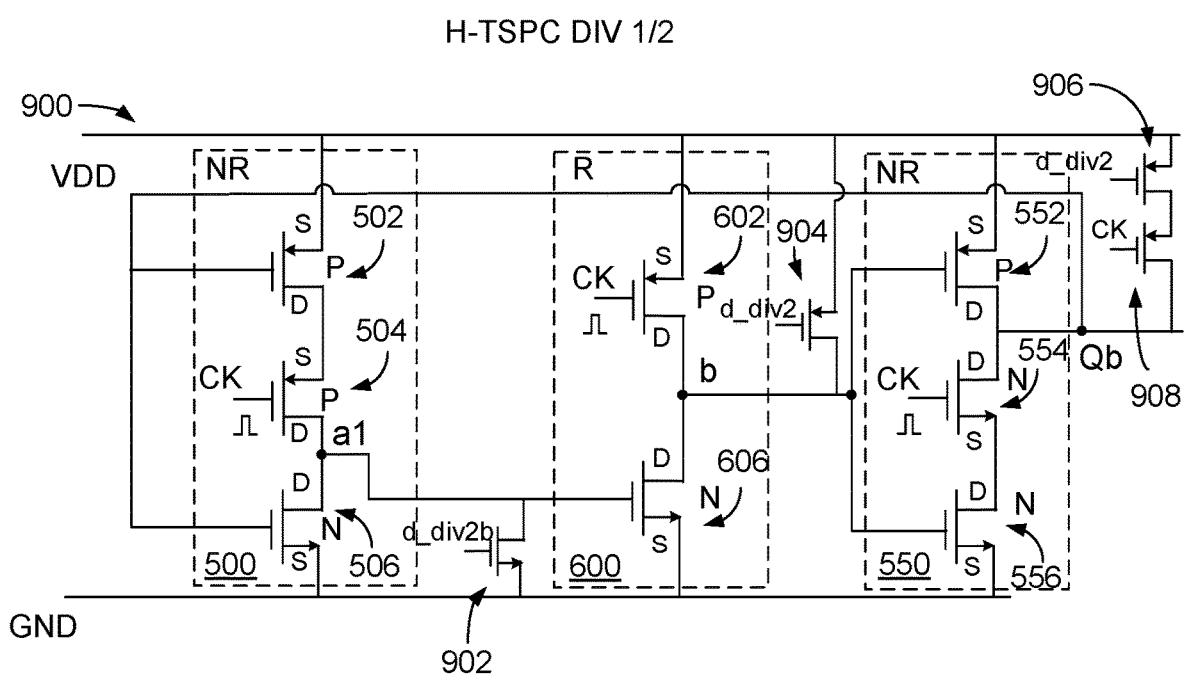
FIG. 9 is a schematic diagram illustrating an example of an alternative embodiment of an H-TSPC DIV 1/2 circuit having a combination of NR logic circuits and an R logic circuit.

FIG. 9 is a schematic diagram illustrating an example of an alternative embodiment of an H-TSPC DIV 1/2 circuit 900 having a combination of NR logic circuits and an R logic circuit. In an exemplary embodiment, the H-TSPC circuit 900 is similar to the H-TSPC DIV 2 circuit 800 but includes pull down transistor device 902, and pull up transistor devices 904 and 906. The transistors are coupled to outputs of the logic circuits 500, 600, and 550, respectively. In an exemplary embodiment, the H-TSPC circuit 900 may be configured to operate in a divide-by-one (DIV 1) mode or a divide-by-two (DIV 2) mode, and may be implemented as the DIV 1/2 divider 751 in FIG. 7. In an exemplary embodiment, the pull down transistor 902 and the pull up transistors 904 and 906 may be used to configure the H-TSPC circuit 900 in either a DIV 1 mode or a DIV 2 mode. For example, gates of the transistors 904 and 906 may be coupled to a first control signal, and a gate of the transistor 902 may be coupled to a second control signal, which may be opposite the first control signal. In an exemplary embodiment, one or more of the pull down transistor 902 and the pull up transistors 904 and 906 may be referred to as mode switching devices. Mode switching devices may be implemented using devices or components other than those illustrated. In some examples, a mode switching device may include one or more components other than the MOSFETs illustrated in FIG. 9 which is/are configured to pull up or pull down an output of a logic circuit in a frequency divider. In an exemplary embodiment, the pull down transistor 902 may be an NMOS transistor and the pull up transistors 904 and 906 may be PMOS transistors. Further, a transistor 908 coupled between the pull up transistor 906 and the output of the logic circuit 550 may be a PMOS transistor. Alternatively, the polarity of the transistors 902, 904, 906 and 908 may be reversed. A gate of the transistor 908 may be coupled to the clock signal, CK.

In an exemplary embodiment, when the H-TSPC DIV 1/2 circuit 900 is in a DIV 1 mode, the clock signal, CK traverses one buffer at a frequency $F_{VCO}$. In an exemplary embodiment, in DIV 1 mode, the single buffer may comprise the transistors 554, 556, 906 and 908. When the signal d_div2 applied to the gate of the transistor 904 and the gate of the transistor 906 is logic low and the signal d_div2b applied to the gate of the transistor 902 is logic high, the transistor 902 is on, which pulls node a1 to logic low. The transistor 904 is also on, which pulls node b to logic high. With the node b at logic high, the transistor 552 is off. In this manner, the transistors 906, 908, 554 and 556 function as a single buffer for the input signal CK. In this manner, a multiplexer that uses at least two logic gates and that is always consuming power, and that may otherwise be used to bypass the DIV 1/2 divider 751 (FIG. 7) may be eliminated and the single buffer (transistors 906, 908, 554 and 556) may be used when the H-TSPC circuit 900 is in DIV 1 mode, essentially allowing the H-TSPC circuit 900 to function as a bypass circuit when in DIV 1 mode. In an exemplary embodiment, the H-TSPC circuit 900 may be implemented as the DIV 1/2 divider 751 (FIG. 7) instead of a multiplexer, thereby eliminating the power consumed by a multiplexer, while still effectively functioning as a bypass circuit.

In an exemplary embodiment, when the H-TSPC circuit 900 is in a DIV 2 mode, the signal Qb appears at the output at one half the frequency of the CK signal. When the signal d_div2 applied to the gate of the transistor 904 and the gate of the transistor 906 is logic high and the signal d_div2b applied to the gate of the transistor 902 is logic low, the transistors 902, 904 and 906 are all off and do not have any effect on the H-TSPC circuit 900. In this DIV 2 mode, the H-TSPC circuit 900 in FIG. 9 functions similar to the H-TSPC circuit 800 in FIG. 8.

In an exemplary embodiment, implementing the DIV 1/2 divider 751 of FIG. 7 using the H-TSPC DIV 1/2 circuit 900 provides the advantage of improving the critical timing so as to boost the maximum operating frequency without sacrificing the minimum operating frequency. For example, implementing the H-TSPC DIV 1/2 circuit 900 using the R logic circuit 600 as the middle stage reduces the timing delay through the H-TSPC circuit 900 and allows the DIV 1/2 divider 751 of FIG. 7 to work at higher frequency when operating in DIV 2 mode. In other embodiments, an H-TSPC including at least one R logic circuit and at least one NR logic circuit may include more than three logic circuits (e.g., more logic circuits than illustrated in FIG. 9) configured in a ring. In some such embodiments, (selectable) divide ratios other than those discussed with respect to FIG. 9 may be implemented.

Figure 10:
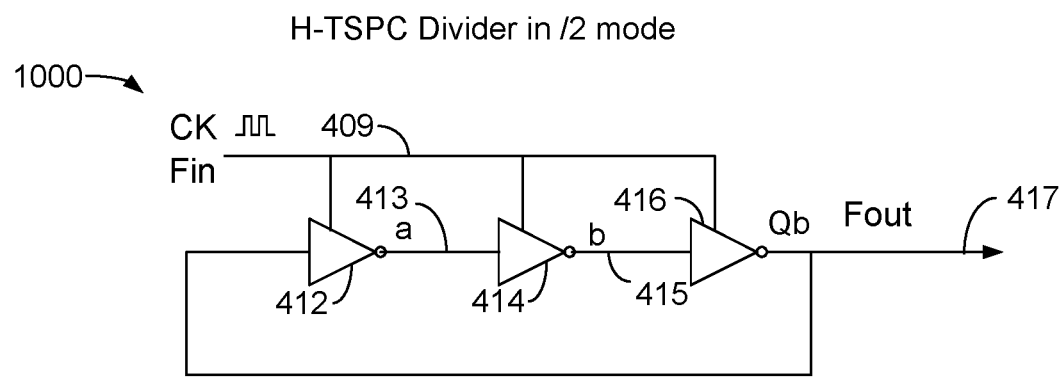
FIG. 10 shows an exemplary embodiment of an H-TSPC divider circuit configured in a divide-by-two (DIV 2) mode.

FIG. 10 shows an exemplary embodiment of an H-TSPC divider circuit 1000 configured in a divide-by-two (DIV 2) mode. The H-TSPC divider circuit 1000 may be similar to the divider circuit 400 (FIG. 4) and implemented as shown in FIG. 9. When configured in a divide-by-two (DIV 2) mode, the frequency, Fout, at the node Qb is one-half of the input frequency, Fin.

Figure 11:
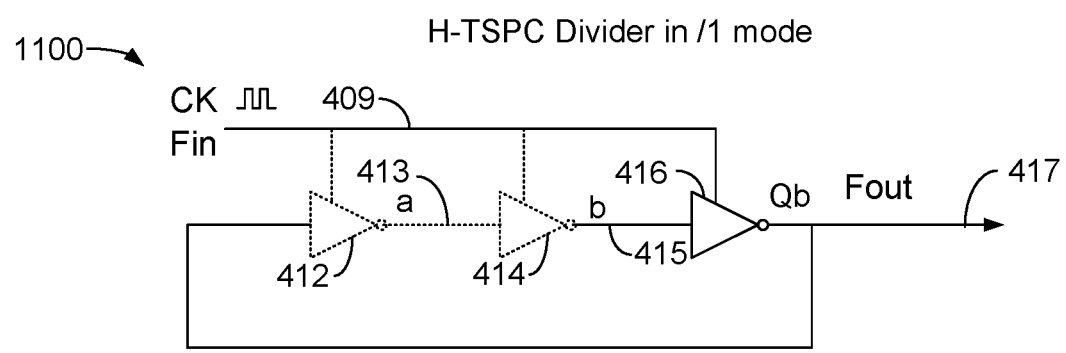
FIG. 11 shows an exemplary embodiment of an H-TSPC divider circuit configured in a divide-by-one (DIV 1) mode.

FIG. 11 shows an exemplary embodiment of an H-TSPC divider circuit 1100 configured in a divide-by-one (DIV 1) mode. The H-TSPC divider circuit 1100 may be similar to the divider circuit 400 (FIG. 4) and may be implemented as shown in FIG. 9. When configured in a divide-by-one (DIV 1) mode, the inverters 412 and 414 are disabled and the frequency, Fout, at the node Qb is the same as the input frequency, Fin. The single inverter 416 effectively allows the input signal, Fin, to effectively bypass the H-TSPC divider circuit 1100 using fewer components than would a multiplexer.

Figure 12:
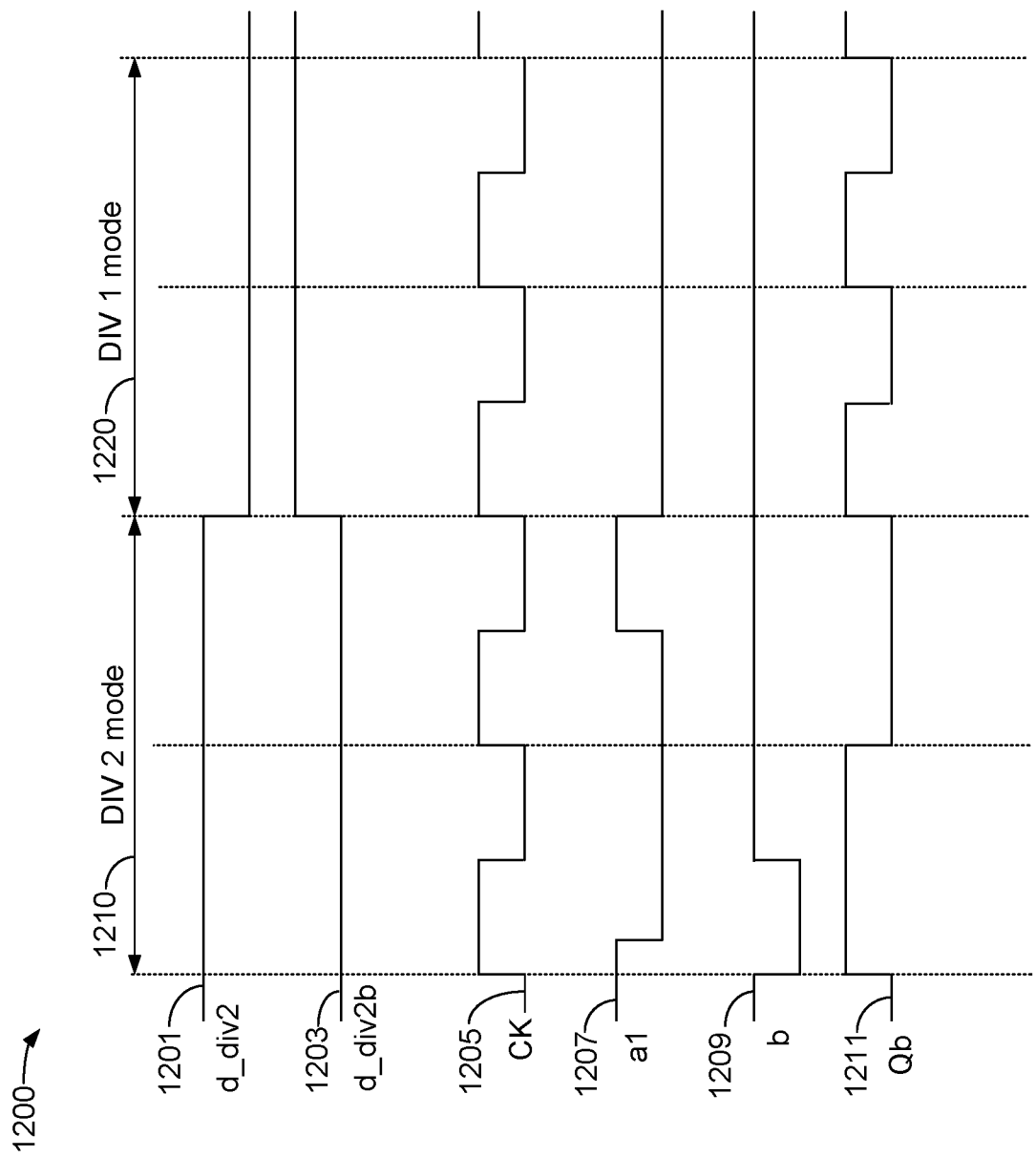
FIG. 12 is a timing diagram showing the operation of the H-TSPC circuit in both a DIV 1 mode and a DIV 2 mode.

FIG. 12 is a timing diagram 1200 showing the operation of the H-TSPC circuit 900 in both a DIV 1 mode and a DIV 2 mode. The timing diagram 1200 comprises a first portion 1210 showing the timing of the H-TSPC circuit 900 in a DIV 2 mode, and a second portion 1220 showing the timing of the H-TSPC circuit 900 in a DIV 1 mode.

In an exemplary embodiment, the d_div2 signal is shown using reference numeral 1201, the d_div2b signal is shown using reference numeral 1203, the CK signal is shown using reference numeral 1205, the signal at node a1 is shown using reference numeral 1207, the signal at node b is shown using reference numeral 1209, and the signal at node Qb is shown using reference numeral 1211.

In an exemplary embodiment, the first portion 1210 shows that the d_div2 signal 1201 is logic high and that the d_div2b signal 1203 is logic low. This has the effect of turning off the transistors 902, 904, and 906 (FIG. 9) such that they do not have any effect on the H-TSPC circuit 900 (FIG. 9) resulting in the Qb signal 1211 operating at one-half the frequency of the CK signal 1205 in DIV 2 mode.

In an exemplary embodiment, the second portion 1220 shows that the d_div2 signal 1201 is logic low and that the d_div2b signal 1203 is logic high. This has the effect of turning on the transistors 902, 904, and 906 (FIG. 9) resulting in the Qb signal 1211 operating at the same frequency as the CK signal 1205 in DIV 1 mode.

Figure 13:
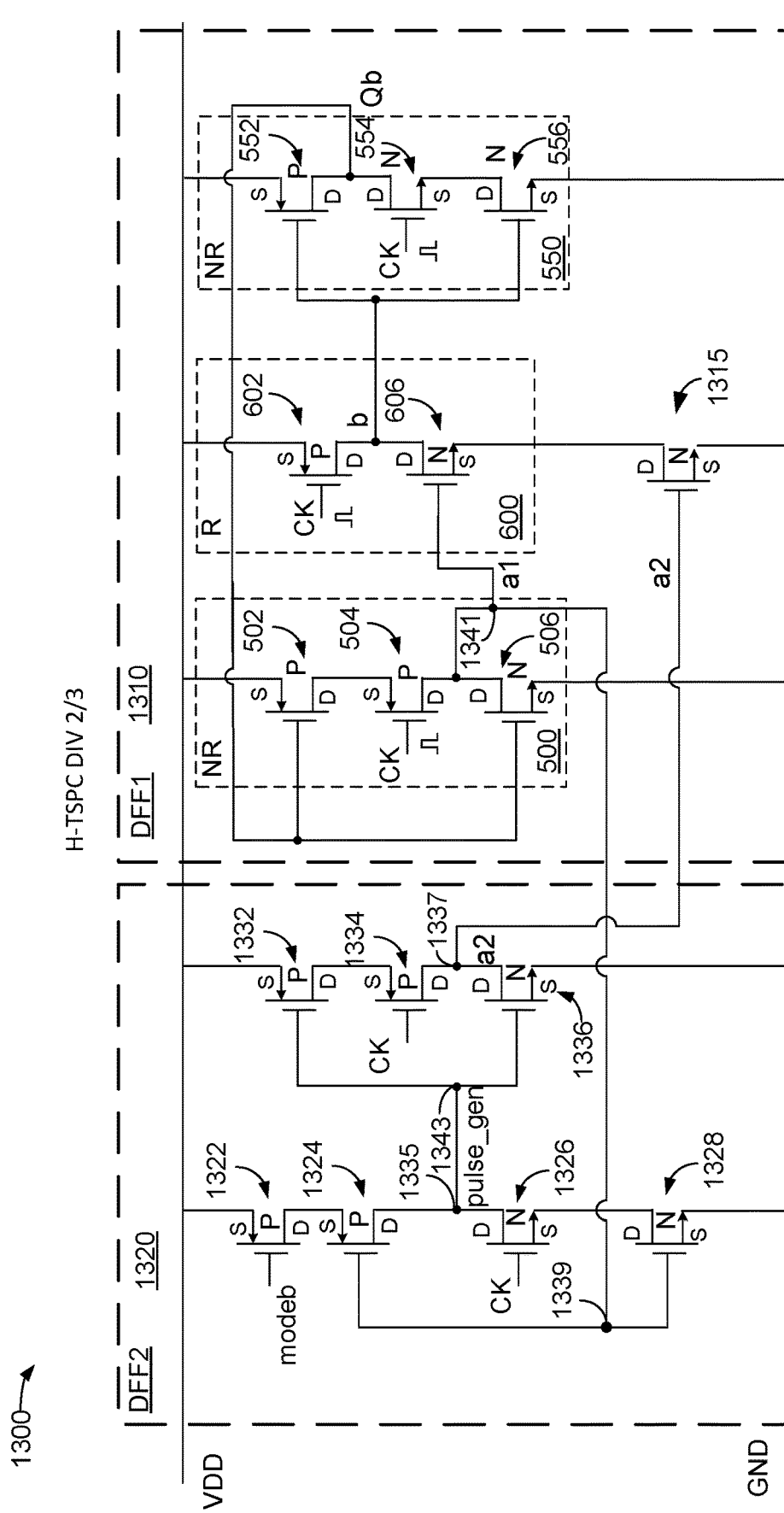
FIG. 13 is a schematic diagram illustrating an example of an alternative embodiment of an H-TSPC DIV 2/3 circuit having a combination of NR logic circuits and an R logic circuit.

FIG. 13 is a schematic diagram illustrating an example of an alternative embodiment of an H-TSPC DIV 2/3 circuit 1300 having a combination of NR logic circuits and an R logic circuit. In an exemplary embodiment, the H-TSPC circuit 1300 may comprise a divider circuit 1310 and additional circuit 1320.

In an exemplary embodiment, the H-TSPC circuit 1310 is similar to the H-TSPC circuit 800, but includes an additional transistor 1315 that is configured to operate with the additional circuit 1320 to allow the H-TSPC circuit 1300 to operate in a divide-by-two (DIV 2) mode or in a divide-by-three (DIV 3) mode. In an exemplary embodiment, the additional circuit 1320 may be referred to as a "pulse generator" circuit that is configured to generate a signal, referred to as a2, that causes the H-TSPC circuit 1310 to operate in a DIV 3 mode.

In an exemplary embodiment, the additional circuit 1320 may comprise PMOS transistor devices 1322, 1324, 1332 and 1134; and may comprise NMOS transistor devices 1326, 1328 and 1336. A source of the PMOS transistor device 1322 may be coupled to a system voltage, VDD, and a drain of the PMOS transistor device 1322 may be coupled to a source of the PMOS transistor device 1324. The drain of the PMOS transistor device 1324 may be coupled to the drain of the NMOS transistor device 1326. A source of the NMOS transistor device 1326 may be coupled to a drain of the NMOS transistor device 1328. A source of the NMOS transistor device 1328 may be coupled to a system ground. A node 1335 is formed at the drain of the PMOS transistor device 1324 and the drain of the NMOS transistor device 1326.

A source of the PMOS transistor device 1332 may be coupled to a system voltage, VDD, and a drain of the PMOS transistor device 1332 may be coupled to a source of the PMOS transistor device 1334. The drain of the PMOS transistor device 1334 may be coupled to the drain of the NMOS transistor device 1336. A source of the NMOS transistor device 1336 may be coupled to a system ground. A node 1337 is formed at the drain of the PMOS transistor device 1334 and the drain of the NMOS transistor device 1336.

A gate of the PMOS transistor device 1324 may be coupled to a gate of the NMOS transistor device 1328. A node 1339 may be coupled to a node 1341 at the connection of the drain of the PMOS transistor device 504 and the drain of the NMOS transistor device 506. The node 1341 provides an "a1" signal output provided by the inverter 500.

The signal at the node 1335 may be referred to as a "pulse_gen" signal and is also present at the node 1343 formed at the gate of the PMOS transistor device 1332 and the gate of the NMOS transistor device 1336.

A signal "modeb" may be provided to the gate of the PMOS transistor device 1322 and a CK signal may be provided to the gate of the NMOS transistor device 1326 and to the gate of the NMOS transistor device 1334.

In an exemplary embodiment, a signal referred to as "a2" appears at the node 1337 and is applied to the gate of the NMOS transistor device 1315. When the H-TSPC circuit 1300 is in DIV3 mode, the a2 signal at the gate of the NMOS transistor device 1315 is at logic low, turning off the NMOS transistor device 1315, and causing node b to remain logic high for an additional clock pulse. In this manner, the Qb output of the NR logic circuit 550 will exhibit a DIV 3 output of the H-TSPC circuit 1300 in this mode.

Figure 14:
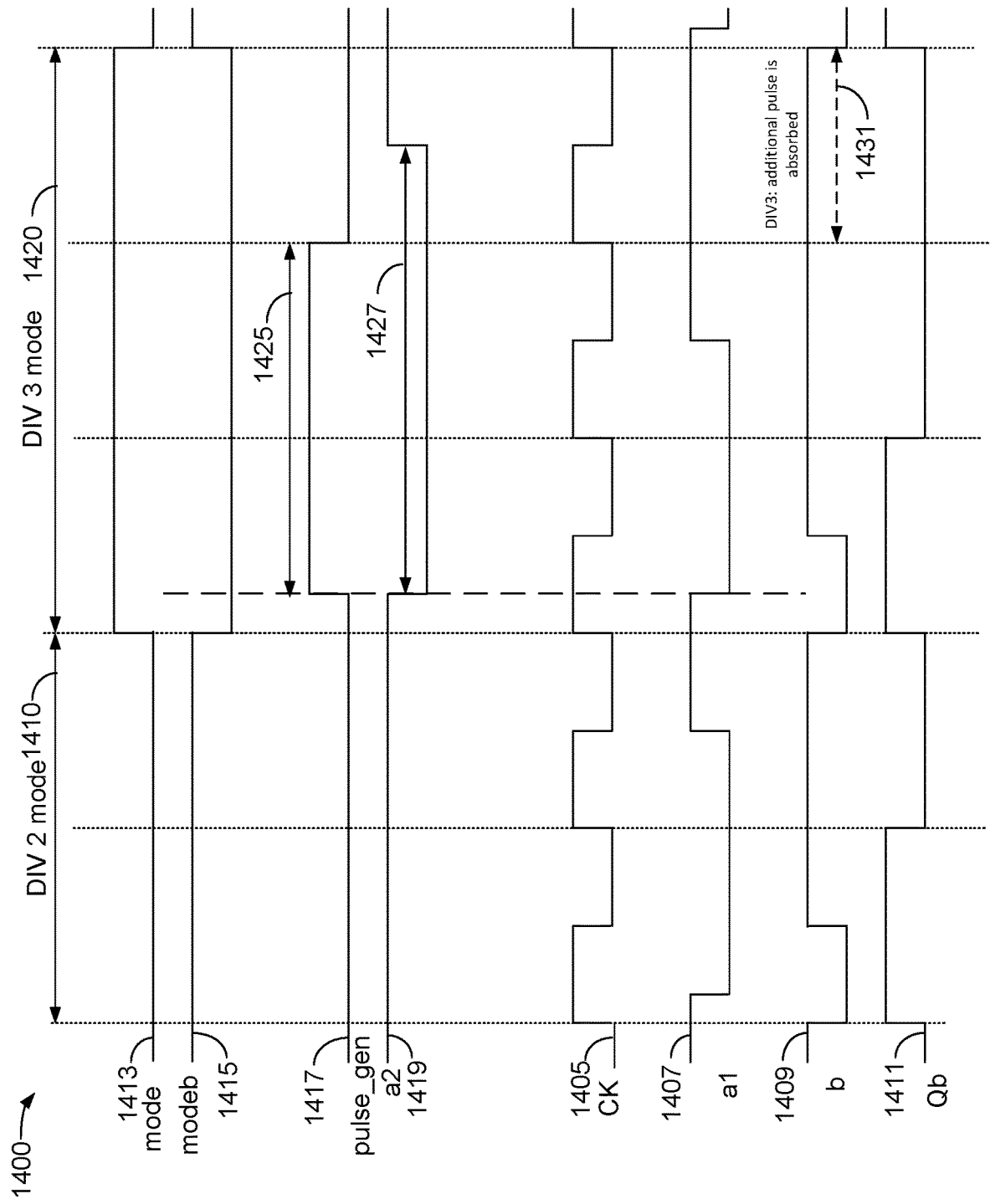
FIG. 14 is a timing diagram showing the operation of the H-TSPC circuit in both a DIV 2 mode and a DIV 3 mode.

FIG. 14 is a timing diagram 1400 showing the operation of the H-TSPC circuit 1300 in both a DIV 2 mode and a DIV 3 mode. The timing diagram 1400 comprises a first portion 1410 showing the timing of the H-TSPC circuit 1300 in a DIV 2 mode, and a second portion 1420 showing the timing of the H-TSPC circuit 1300 in a DIV 3 mode.

In an exemplary embodiment, a mode signal is shown using reference numeral 1413, a modeb signal is shown using reference numeral 1415, a pulse_gen signal is shown using reference numeral 1417 and the signal at node 1337 "a2" is shown using reference numeral 1419. The CK signal is shown using reference numeral 1405, the signal at node 1341 "a1" is shown using reference numeral 1407, the signal at node b is shown using reference numeral 1409, and the signal at node Qb is shown using reference numeral 1411.

In an exemplary embodiment, the first portion 1410 shows that the mode signal 1413 is logic low and the modeb signal 1415 is logic high, the pulse_gen signal 1417 is logic low and the a2 signal at node 1337 is logic high, thus the NMOS transistor device 1315 is always on. This results in the H-TSPC circuit 1300 (FIG. 13) operating in DIV 2 mode, resulting in the Qb signal 1411 operating at one-half the frequency of the CK signal 1405 in DIV 2 mode.

In an exemplary embodiment, the second portion 1420 shows that the mode signal 1413 is logic high, the modeb signal 1415 is logic low, the pulse_gen signal is logic high for a time period 1425 and that the a2 signal 1419 at node 1337 is logic low for a time period 1427. This results in the H-TSPC circuit 1300 (FIG. 13) operating in DIV 3 mode, resulting in the Qb signal 1411 operating at one-third of the frequency of the CK signal 1405 in DIV 3 mode. The time period 1431 shows that the additional pulse is absorbed due to the logical low a2 signal being applied to the gate of the NMOS transistor 1315, causing the Qb signal 1411 to operate at one-third of the frequency of the CK signal 1405 in DIV 3 mode.

Figure 15:
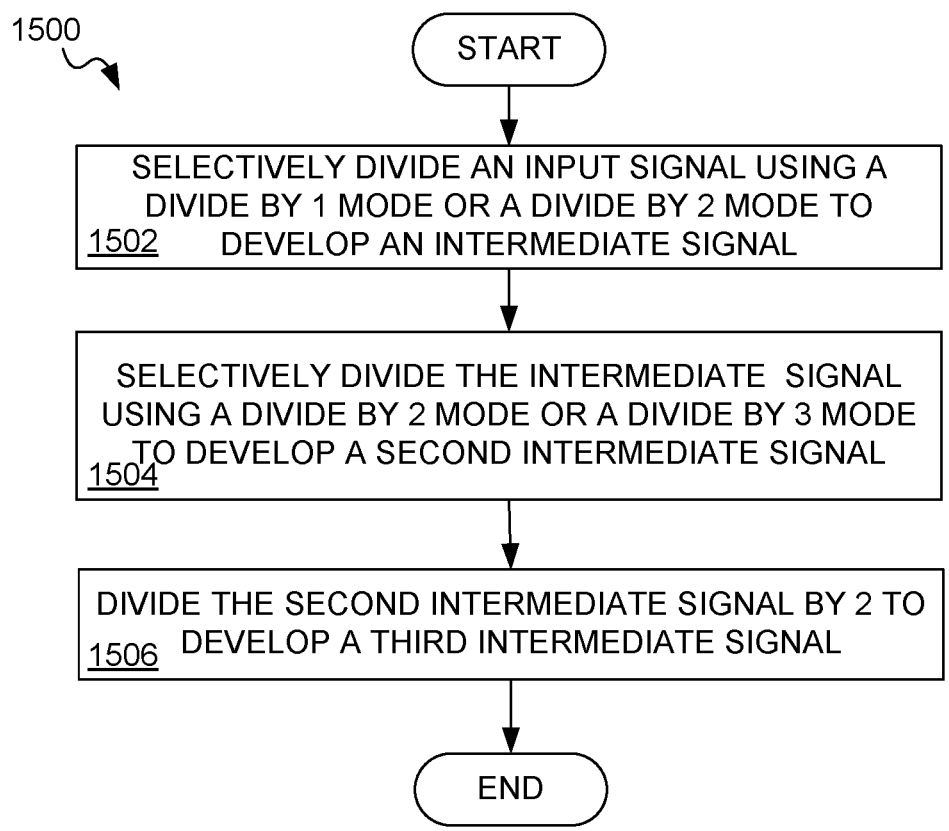
FIG. 15 is a flow chart describing an example of a method for operating a frequency divider in accordance with an exemplary embodiment of the disclosure.

FIG. 15 is a flow chart 1500 describing an example of a method for operating a prescaler for a frequency divider. The blocks in the method 1500 can be performed in or out of the order shown, and in some embodiments, can be performed at least in part in parallel.

In block 1502, an input signal is selectively divided in a divide by one (1) mode or a divide by two (2) mode to develop an intermediate signal. For example, the DIV 1/2 divider 751 may be selectively configured to divide an input signal, FVCO, by one (DIV1 mode) or by two (DIV 2 mode).

In block 1504, the intermediate signal is selectively divided in a divide by two (2) mode or a divide by three (3) mode to develop a second intermediate signal. For example, the DIV 2/3 divider 754 may be selectively configured to divide the intermediate signal by two (DIV 2 mode) or by three (DIV 3 mode).

In block 1506, the second intermediate signal is divided by two (2) to develop a third intermediate signal. For example, the DIV 2 divider 757 may be configured to divide the second intermediate signal by two (DIV 2).

Figure 16:
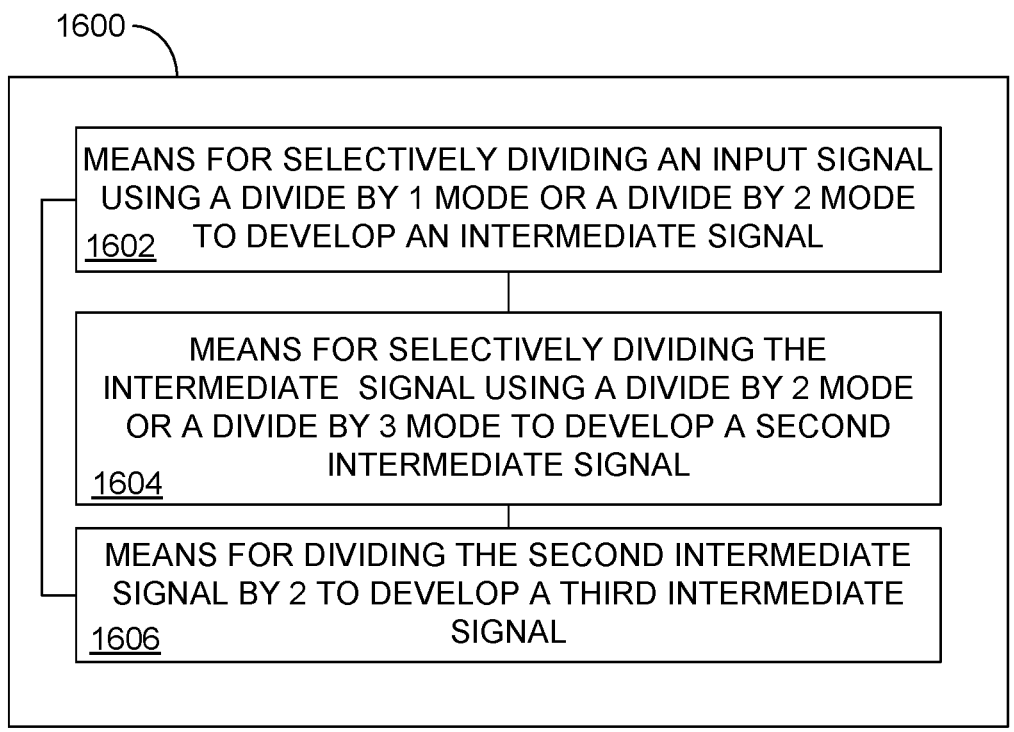
FIG. 16 is a functional block diagram of an apparatus for a frequency divider in accordance with an exemplary embodiment of the disclosure.

FIG. 16 is a functional block diagram of an apparatus for a prescaler for a frequency divider in accordance with an exemplary embodiment of the disclosure.

The apparatus 1600 comprises means 1602 for selectively dividing an input signal in a divide by one (1) mode or a divide by two (2) mode to develop an intermediate signal. In certain embodiments, the means 1602 for selectively dividing an input signal in a divide by one (1) mode or a divide by two (2) mode to develop an intermediate signal can be configured to perform one or more of the functions described in operation block 1502 of the method 1500 (FIG. 15). In an exemplary embodiment, the means 1502 for selectively dividing an input signal in a divide by one (1) mode or a divide by two (2) mode to develop an intermediate signal may comprise the DIV 1/2 divider 751 or components thereof. For example, the DIV 1/2 divider 751 may be selectively configured to divide an input signal, FVCO, by one (DIV 1 mode) or by two (DIV 2 mode).

The apparatus 1600 comprises means 1604 for selectively dividing an input signal in a divide by two (2) mode or a divide by three (3) mode to develop a second intermediate signal. In certain embodiments, the means 1604 for selectively dividing an input signal in a divide by two (2) mode or a divide by three (3) mode to develop a second intermediate signal can be configured to perform one or more of the functions described in operation block 1504 of the method 1500 (FIG. 15). In an exemplary embodiment, the means 1504 for selectively dividing an input signal in a divide by two (2) mode or a divide by three (3) mode to develop a second intermediate signal may comprise the DIV 2/3 divider 754 or components thereof. For example, the DIV 2/3 divider 754 may be selectively configured to divide an intermediate signal by two (DIV 2 mode) or by three (DIV 3 mode).

The apparatus 1600 comprises means 1606 for dividing an input signal by 2 to develop a third intermediate signal. In certain embodiments, the means 1606 for dividing an input signal by 2 to develop a third intermediate signal can be configured to perform one or more of the functions described in operation block 1506 of the method 1500 (FIG. 15). In an exemplary embodiment, the means 1506 for dividing an input signal by 2 to develop a third intermediate signal may comprise the DIV 2 divider 7547 or components thereof, which may be configured to divide the second intermediate signal by two (DIV 2).

Figure 17:
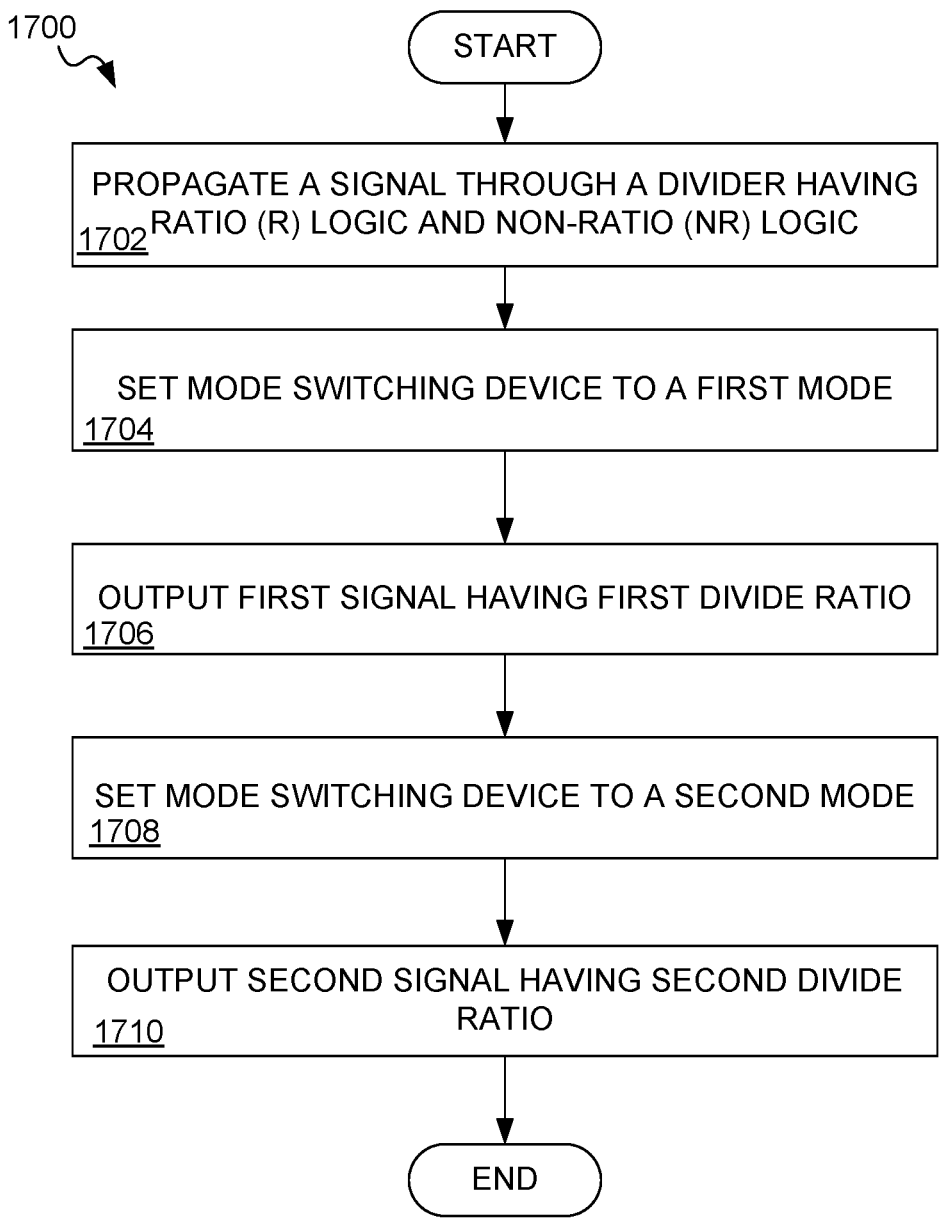
FIG. 17 is a flow chart describing an example of a method for operating a divider in accordance with an exemplary embodiment of the disclosure.

FIG. 17 is a flow chart describing an example of a method for operating a divider in accordance with an exemplary embodiment of the disclosure. The blocks in the method 1700 can be performed in or out of the order shown, and in some embodiments, can be performed at least in part in parallel.

In block 1702, a signal is propagated through a divider having a ratio (R) logic and a non-ratio (NR) logic. For example, a signal may propagate through an H-TSPC DIV 1/2 circuit 900 having a combination of NR logic circuits and an R logic circuit.

In block 1704, a mode switching device may be set to a first mode. For example, one or more of the pull down transistor 902 and the pull up transistors 904 and 906 may be used to configure the H-TSPC circuit 900 in either a DIV 1 mode or a DIV 2 mode.

In block 1706, a signal having a first divide ratio may be output. For example, if the H-TSPC circuit 900 is configured in DIV 1 mode, then an output signal at the same frequency as an input signal may be output.

In block 1708, a mode switching device may be set to a second mode. For example, one or more of the pull down transistor 902 and the pull up transistors 904 and 906 may be used to configure the H-TSPC circuit 900 in the other of the DIV 1 mode or the DIV 2 mode.

In block 1710, a signal having a second divide ratio may be output. For example, if the H-TSPC circuit 900 is configured in DIV 2 mode, then an output signal at a frequency that is one half the frequency of an input signal may be output.

Figure 18:
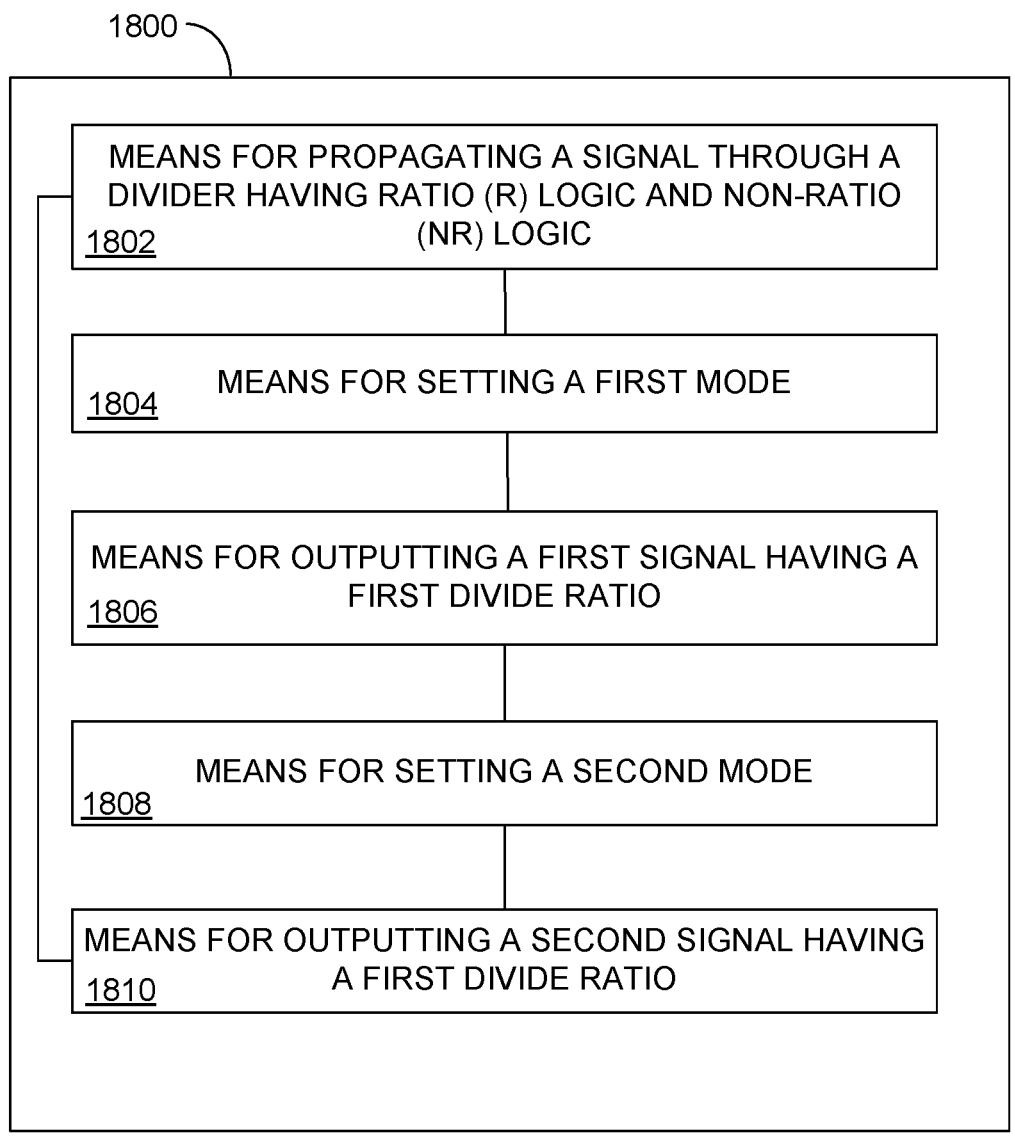
FIG. 18 is a functional block diagram of an apparatus for a divider in accordance with an exemplary embodiment of the disclosure.

FIG. 18 is a functional block diagram of an apparatus for a divider in accordance with an exemplary embodiment of the disclosure.

The apparatus 1800 comprises means 1802 for propagating a signal through a divider having a ratio (R) logic and a non-ratio (NR) logic. In certain embodiments, the means 1802 for propagating a signal through a divider having a ratio (R) logic and a non-ratio (NR) logic can be configured to perform one or more of the functions described in operation block 1702 of the method 1700 (FIG. 17). In an exemplary embodiment, the means 1802 for propagating a signal through a divider having a ratio (R) logic and a non-ratio (NR) logic may comprise components of the H-TSPC DIV 1/2 circuit 900 having a combination of NR logic circuits and an R logic circuit.

The apparatus 1800 comprises means 1804 for setting a first mode. In certain embodiments, the means 1804 for setting a first mode can be configured to perform one or more of the functions described in operation block 1704 of the method 1700 (FIG. 17). In an exemplary embodiment, the means 1804 for setting a first mode may comprise one or more of the pull down transistor 902 and the pull up transistors 904 and 906, which may be used to configure the H-TSPC circuit 900 in either a DIV 1 mode or a DIV 2 mode. The means 1804 may additionally or in the alternative comprise the processor 210.

The apparatus 1800 comprises means 1806 for outputting a first signal having a first divide ratio. In certain embodiments, the means 1806 for outputting a first signal having a first divide ratio can be configured to perform one or more of the functions described in operation block 1706 of the method 1700 (FIG. 17). In an exemplary embodiment, the means 1806 for outputting a first signal having a first divide ratio may comprise components of the H-TSPC circuit 900, which may be configured in a DIV 1 mode, such that an output signal at the same frequency as an input signal may be output.

The apparatus 1800 comprises means 1808 for setting a second mode. In certain embodiments, the means 1808 for setting a second mode can be configured to perform one or more of the functions described in operation block 1708 of the method 1700 (FIG. 17). In an exemplary embodiment, the means 1808 for setting a second mode may comprise one or more of the pull down transistor 902 and the pull up transistors 904 and 906, which may be used to configure the H-TSPC circuit 900 in the other of the DIV 1 mode or the DIV 2 mode. The means 1808 may additionally or in the alternative comprise the processor 210.

The apparatus 1800 comprises means 1810 for outputting a second signal having a second divide ratio. In certain embodiments, the means 1810 for outputting a second signal having a second divide ratio can be configured to perform one or more of the functions described in operation block 1710 of the method 1700 (FIG. 17). In an exemplary embodiment, the means 1810 for outputting a second signal having a second divide ratio may comprise components of the H-TSPC circuit 900, which may be configured in a DIV 2 mode, such that an output signal at one half the frequency of an input signal may be output.

Implementation examples are described in the following numbered clauses:

1. A hybrid true single-phase clock (H-TSPC) circuit, comprising a first logic circuit comprising non-ratio (NR) logic; a first mode switching device coupled to an output of the first logic circuit; a second logic circuit comprising ratio (R) logic, the second logic circuit configured to receive an output of the first logic circuit; a second mode switching device coupled to an output of the second logic circuit; a third logic circuit comprising non-ratio (NR) logic, the third logic circuit configured to receive an output of the second logic circuit; and a third mode switching device coupled to an output of the third logic circuit, wherein the first logic circuit, second logic circuit, and third logic circuit are configured in a ring.

2. The H-TSPC circuit of clause 1, wherein the first logic circuit comprising NR logic comprises first and second transistors of a first type and comprises a third transistor of a second type; the second logic circuit comprising R logic comprises a fourth transistor of the first type and a fifth transistor of the second type, and the third logic circuit comprising NR logic comprises a sixth transistor of the first type and comprises seventh and eighth transistors of the second type.

3. The H-TSPC circuit of any of clauses 1 through 2, wherein the first mode switching device comprises a pull down transistor, the second mode switching device comprises a first pull up transistor, and the third mode switching device comprises a second pull up transistor.

4. The H-TSPC circuit of any of clauses 1 through 3, further comprising a transistor coupled between the second pull up transistor and the output of the third logic circuit, wherein a gate of the pull down transistor is configured to receive a first control signal, a gate of the first and second pull up transistors are configured to receive a second control signal, and a gate of the transistor coupled between the second pull up transistor and the output of the third logic circuit is configured to receive a clock signal.

5. The H-TSPC circuit of any of clauses 1 through 4, wherein the second control signal is opposite the first control signal.

6. The H-TSPC circuit of clause 1, wherein the H-TSPC circuit forms at least part of a prescaler, and wherein the prescaler further comprises a DIV 2/3 frequency divider implemented as a second H-TSPC circuit coupled to the output of the third logic circuit.

7. The H-TSPC circuit of any of clauses 1 and 6, wherein the second H-TSPC circuit is coupled to the output of the third logic circuit without a multiplexer (MUX).

8. The H-TSPC circuit of any of clauses 1, 6 and 7, further comprising an AB counter configured to generate an initial mode control signal to select whether the DIV 2/3 frequency divider operates as a divide by two (2) frequency divider or a divide by three (3) frequency divider; and a retimer configured to receive an input of the AB counter and an output of the AB counter, the retimer configured to provide an output of a frequency divider circuit.

9. A method for frequency division, comprising propagating a signal through a divider having a ratio logic (R) circuit and a non-ratio (NR) circuit; setting at least one mode switching device that is coupled to an output of the R circuit or the NR circuit to a first mode; outputting a first signal having a first divide ratio; setting the at least one mode switching device that is coupled to an output of the R circuit or the NR circuit to a second mode; and outputting a second signal having a second divide ratio different from the first divide ratio.

10. The method of clause 9, wherein the first mode is a divide by one (1) mode.

11. The method of any of clauses 9 through 10, wherein the first mode is a divide by two (2) mode.

12. A method for frequency division, comprising selectively dividing an input signal by one (1) or by two (2) to develop an intermediate signal; selectively dividing the intermediate signal by two (2) or by three (3) to develop a second intermediate signal; and dividing the second intermediate signal by two (2) to develop a third intermediate signal, wherein the selectively dividing the input signal comprises dividing the input signal with a hybrid true single phase clock (H-TSPC) circuit or wherein the selectively dividing the intermediate signal comprises dividing the intermediate signal with an H-TSPC circuit.

13. The method of clause 12, wherein selectively dividing the input signal by one (1) results in the input signal being directly and selectively divided by two (2) or by three (3).

14. The method of any of clauses 12 through 13, wherein selectively dividing the intermediate signal by two (2) or by three (3) to develop the second intermediate signal results in a divide ratio step size resolution of one (1).

15. A frequency divider circuit, comprising a prescaler having a DIV 1/2 frequency divider, and a DIV 4/5 frequency divider, the DIV 4/5 frequency divider comprising a DIV 2/3 frequency divider and a DIV 2 frequency divider; wherein at least one of the DIV 1/2 frequency divider and the DIV 2/3 frequency divider comprises a hybrid true single phase clock (H-TSPC) architecture; and wherein the H-TSPC architecture comprises a first logic circuit comprising non-ratio (NR) logic; a second logic circuit comprising ratio (R) logic, the second logic circuit configured to receive an output of the first logic circuit; and a third logic circuit comprising non-ratio (NR) logic, the third logic circuit configured to receive an output of the second logic circuit, wherein the first logic circuit, second logic circuit, and third logic circuit are configured in a ring.

16. The frequency divider circuit of clause 15, wherein the DIV 1/2 frequency divider is selectively configured to provide an intermediate signal comprising a divide by one (1) output or a divide by two (2) output, where the divide by one (1) output effectively bypasses the DIV 1/2 frequency divider.

17. The frequency divider circuit of any of clauses 15 through 16, further comprising an AB counter configured to generate an initial mode control signal that selects whether the DIV 2/3 frequency divider operates as a divide by two (2) frequency divider or a divide by three (3) frequency divider; and a retimer configured to receive an input of the AB counter and an output of the AB counter, the retimer configured to provide an output of the frequency divider circuit.

18. The frequency divider circuit of any of clauses 15 through 17, wherein the AB counter determines whether the DIV 4/5 divider operates in a divide by four (DIV 4) mode or a divide by five (DIV 5) mode.

19. The frequency divider circuit of any of clauses 15 through 18, wherein the first logic circuit comprising NR logic comprises first and second transistors of a first type and comprises a third transistor of a second type; the second logic circuit comprising R logic comprises a fourth transistor of the first type and a fifth transistor of the second type, and the third logic circuit comprising NR logic comprises a sixth transistor of the first type and comprises seventh and eighth transistors of the second type.

20. The frequency divider circuit of any of clauses 15 through 19, wherein an output of the first logic circuit is coupled to a pull down transistor, an output of the second logic circuit is coupled to a pull up transistor and an output of the third logic circuit is coupled to another pull up transistor.

21. The frequency divider circuit of any of clauses 15 through 20, wherein the DIV2 frequency divider comprises a true single phase clock (TSPC) architecture.

22. The frequency divider circuit of any of clauses 15 through 21, wherein the DIV 1/2 frequency divider and the DIV 2/3 frequency divider comprise a hybrid true single phase clock (H-TSPC) architecture and the DIV2 frequency divider comprises a true single phase clock (TSPC) architecture.

23. The frequency divider circuit of any of clauses 15 through 22, wherein the DIV 2/3 frequency divider further comprises an additional transistor; and the additional transistor is coupled to an additional circuit configured to allow the DIV 2/3 frequency divider to operate in a divide-by-two (DIV 2) mode or in a divide-by-three (DIV 3) mode.

24. A device, comprising means for selectively dividing an input signal by one (1) or by two (2) to develop an intermediate signal, means for selectively dividing the intermediate signal by two (2) or by three (3) to develop a second intermediate signal, and means for dividing the second intermediate signal by two (2) to develop a third intermediate signal.

25. The device of clause 24, wherein the means for selectively dividing the input signal by one (1) or by two (2) to develop an intermediate signal being operated to selectively divide the input signal by one (1) directly provides the intermediate signal to the means for selectively dividing the intermediate signal by two (2) or by three (3) to develop the second intermediate signal.

26. The device of clause 24 or 25, wherein the means for selectively dividing the intermediate signal by two (2) or by three (3) to develop the second intermediate signal results in a divide ratio step size resolution of one (1).

The circuit architecture described herein described herein may be implemented on one or more ICs, analog ICs, RFICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Although selected aspects have been illustrated and described in detail, it will be understood that various substitutions and alterations may be made therein without departing from the spirit and scope of the present invention, as defined by the following claims.

What is claimed is:

1. A hybrid true single-phase clock (H-TSPC) circuit, comprising:
    a first logic circuit comprising non-ratio (NR) logic;
    a first mode switching device coupled to an output of the first logic circuit;
    a second logic circuit comprising ratio (R) logic, the second logic circuit configured to receive an output of the first logic circuit;
    a second mode switching device coupled to an output of the second logic circuit;
    a third logic circuit comprising non-ratio (NR) logic, the third logic circuit configured to receive an output of the second logic circuit; and
    a third mode switching device coupled to an output of the third logic circuit, wherein the first logic circuit, second logic circuit, and third logic circuit are configured in a ring.

2. The H-TSPC circuit of claim 1, wherein the first logic circuit comprising NR logic comprises first and second transistors of a first type and comprises a third transistor of a second type; the second logic circuit comprising R logic comprises a fourth transistor of the first type and a fifth transistor of the second type, and the third logic circuit comprising NR logic comprises a sixth transistor of the first type and comprises seventh and eighth transistors of the second type.

3. The H-TSPC circuit of claim 1, wherein the first mode switching device comprises a pull down transistor, the second mode switching device comprises a first pull up transistor, and the third mode switching device comprises a second pull up transistor.

4. The H-TSPC circuit of claim 3, further comprising a transistor coupled between the second pull up transistor and the output of the third logic circuit, wherein a gate of the pull down transistor is configured to receive a first control signal, a gate of the first and second pull up transistors are configured to receive a second control signal, and a gate of the transistor coupled between the second pull up transistor and the output of the third logic circuit is configured to receive a clock signal.

5. The H-TSPC circuit of claim 4, wherein the second control signal is opposite the first control signal.

6. The H-TSPC circuit of claim 1, wherein the H-TSPC circuit forms at least part of a prescaler, and wherein the prescaler further comprises a DIV 2/3 frequency divider implemented as a second H-TSPC circuit coupled to the output of the third logic circuit.

7. The H-TSPC circuit of claim 6, wherein the second H-TSPC circuit is coupled to the output of the third logic circuit without a multiplexer (MUX).

8. The H-TSPC circuit of claim 7, further comprising:
    an AB counter configured to generate an initial mode control signal to select whether the DIV 2/3 frequency divider operates as a divide by two (2) frequency divider or a divide by three (3) frequency divider; and
    a retimer configured to receive an input of the AB counter and an output of the AB counter, the retimer configured to provide an output of a frequency divider circuit.

9. A method for frequency division, comprising:
    propagating a signal through a divider having a ratio logic (R) circuit and a non-ratio (NR) circuit;

setting at least one mode switching device that is coupled to an output of the R circuit or the NR circuit to a first mode;

outputting a first signal having a first divide ratio;

setting the at least one mode switching device that is coupled to an output of the R circuit or the NR circuit to a second mode; and outputting a second signal having a second divide ratio different from the first divide ratio.

10. The method of claim 9, wherein the first mode is a divide by one (1) mode.

11. The method of claim 10, wherein the second mode is a divide by two (2) mode.

12. A method for frequency division, comprising:

selectively dividing an input signal by one (1) or by two (2) to develop an intermediate signal;

selectively dividing the intermediate signal by two (2) or by three (3) to develop a second intermediate signal; and dividing the second intermediate signal by two (2) to develop a third intermediate signal, wherein the selectively dividing the input signal comprises dividing the input signal with a hybrid true single phase clock (H-TSPC) circuit or wherein the selectively dividing the intermediate signal comprises dividing the intermediate signal with an H-TSPC circuit.

13. The method of claim 12, wherein selectively dividing the input signal by one (1) results in the input signal being directly and selectively divided by two (2) or by three (3).

14. The method of claim 12, wherein selectively dividing the intermediate signal by two (2) or by three (3) to develop the second intermediate signal results in a divide ratio step size resolution of one (1).

15. A frequency divider circuit, comprising:

a prescaler having a DIV 1/2 frequency divider, and a DIV 4/5 frequency divider, the DIV 4/5 frequency divider comprising a DIV 2/3 frequency divider and a DIV 2 frequency divider;

wherein at least one of the DIV 1/2 frequency divider and the DIV 2/3 frequency divider comprises a hybrid true single phase clock (H-TSPC) architecture; and wherein the H-TSPC architecture comprises:

a first logic circuit comprising non-ratio (NR) logic;

a second logic circuit comprising ratio (R) logic, the second logic circuit configured to receive an output of the first logic circuit; and a third logic circuit comprising non-ratio (NR) logic, the third logic circuit configured to receive an output of the second logic circuit, wherein the first logic circuit, second logic circuit, and third logic circuit are configured in a ring.

16. The frequency divider circuit of claim 15, wherein the DIV 1/2 frequency divider is selectively configured to provide an intermediate signal comprising a divide by one (1) output or a divide by two (2) output, where the divide by one (1) output effectively bypasses the DIV 1/2 frequency divider.

17. The frequency divider circuit of claim 15, further comprising:

an AB counter configured to generate an initial mode control signal that selects whether the DIV 2/3 frequency divider operates as a divide by two (2) frequency divider or a divide by three (3) frequency divider; and a retimer configured to receive an input of the AB counter and an output of the AB counter, the retimer configured to provide an output of the frequency divider circuit.

18. The frequency divider circuit of claim 17, wherein the AB counter determines whether the DIV 4/5 divider operates in a divide by four (DIV 4) mode or a divide by five (DIV 5) mode.

19. The frequency divider circuit of claim 15, wherein the first logic circuit comprising NR logic comprises first and second transistors of a first type and comprises a third transistor of a second type; the second logic circuit comprising R logic comprises a fourth transistor of the first type and a fifth transistor of the second type, and the third logic circuit comprising NR logic comprises a sixth transistor of the first type and comprises seventh and eighth transistors of the second type.

20. The frequency divider circuit of claim 19, wherein an output of the first logic circuit is coupled to a pull down transistor, an output of the second logic circuit is coupled to a pull up transistor and an output of the third logic circuit is coupled to another pull up transistor.

21. The frequency divider circuit of claim 15, wherein the DIV2 frequency divider comprises a true single phase clock (TSPC) architecture.

22. The frequency divider circuit of claim 15, wherein the DIV 1/2 frequency divider and the DIV 2/3 frequency divider comprise a hybrid true single phase clock (H-TSPC) architecture and the DIV2 frequency divider comprises a true single phase clock (TSPC) architecture.

23. The frequency divider circuit of claim 15, wherein:

the DIV 2/3 frequency divider further comprises an additional transistor; and the additional transistor is coupled to an additional circuit configured to allow the DIV 2/3 frequency divider to operate in a divide-by-two (DIV 2) mode or in a divide-by-three (DIV 3) mode.

\* \* \* \* \*